(12) United States Patent
Kim

(10) Patent No.: US 7,714,372 B2
(45) Date of Patent: May 11, 2010

(54) DYNAMIC RANDOM ACCESS MEMORY DEVICES AND METHODS OF FORMING THE SAME

(75) Inventor: Dong-Hyun Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 224 days.

(21) Appl. No.: 12/070,875

(22) Filed: Feb. 21, 2008

(65) Prior Publication Data
US 2008/0203456 A1    Aug. 28, 2008

(30) Foreign Application Priority Data
Feb. 22, 2007    (KR) ...................... 10-2007-0017980

(51) Int. Cl.
*H01L 27/108*    (2006.01)
(52) U.S. Cl. ............... 257/306; 257/308; 257/E27.084; 257/E27.088; 257/E21.649; 438/253
(58) Field of Classification Search .................. 257/306, 257/308, E27.084, E27.088, E21.649; 438/253
See application file for complete search history.

(56) References Cited

U.S. PATENT DOCUMENTS 7,253,099 B2 *    8/2007    Hwang et al. ................ 438/637

2006/0234166 A1    10/2006    Lee et al. .................... 430/313
2006/0240361 A1    10/2006    Lee et al. .................... 430/313

FOREIGN PATENT DOCUMENTS

| JP | 11-297965 | 10/1999 |
|---|---|---|
| KR | 10-0155880 | 4/1997 |
| KR | 1020010020757 | 3/2001 |
| KR | 1020050018282 | 2/2005 |
| KR | 1020060031429 | 4/2006 |
| KR | 1020060110097 | 10/2006 |
| KR | 1020060110706 | 10/2006 |

* cited by examiner

*Primary Examiner*—Tu-Tu V Ho
(74) *Attorney, Agent, or Firm*—Myers Bigel Sibley & Sajovec, P.A.

(57) ABSTRACT

Dynamic random access memory (DRAM) devices include first node pads and second node pads alternately arranged in a first direction on a substrate to form a first pad column. A width of the second node pads in a second direction, perpendicular to the first direction, is greater than a width of the first node pads in the second direction. Storage electrodes are electrically connected to the first node pads and the second node pads. Bit line pads may be arranged in the first direction on the substrate to form a second pad column. The second pad column is adjacent the first pad column and displaced therefrom in the second direction.

25 Claims, 21 Drawing Sheets

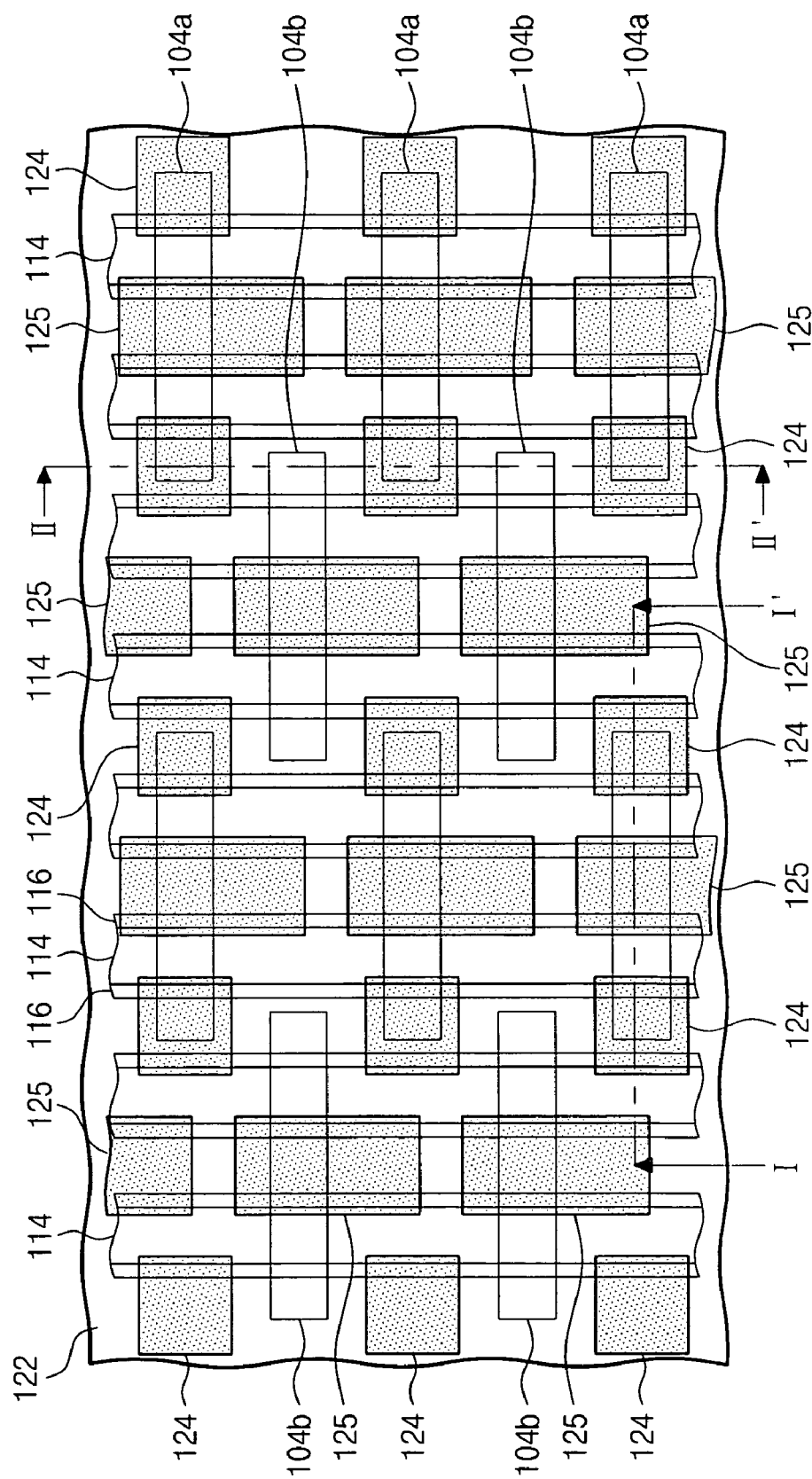

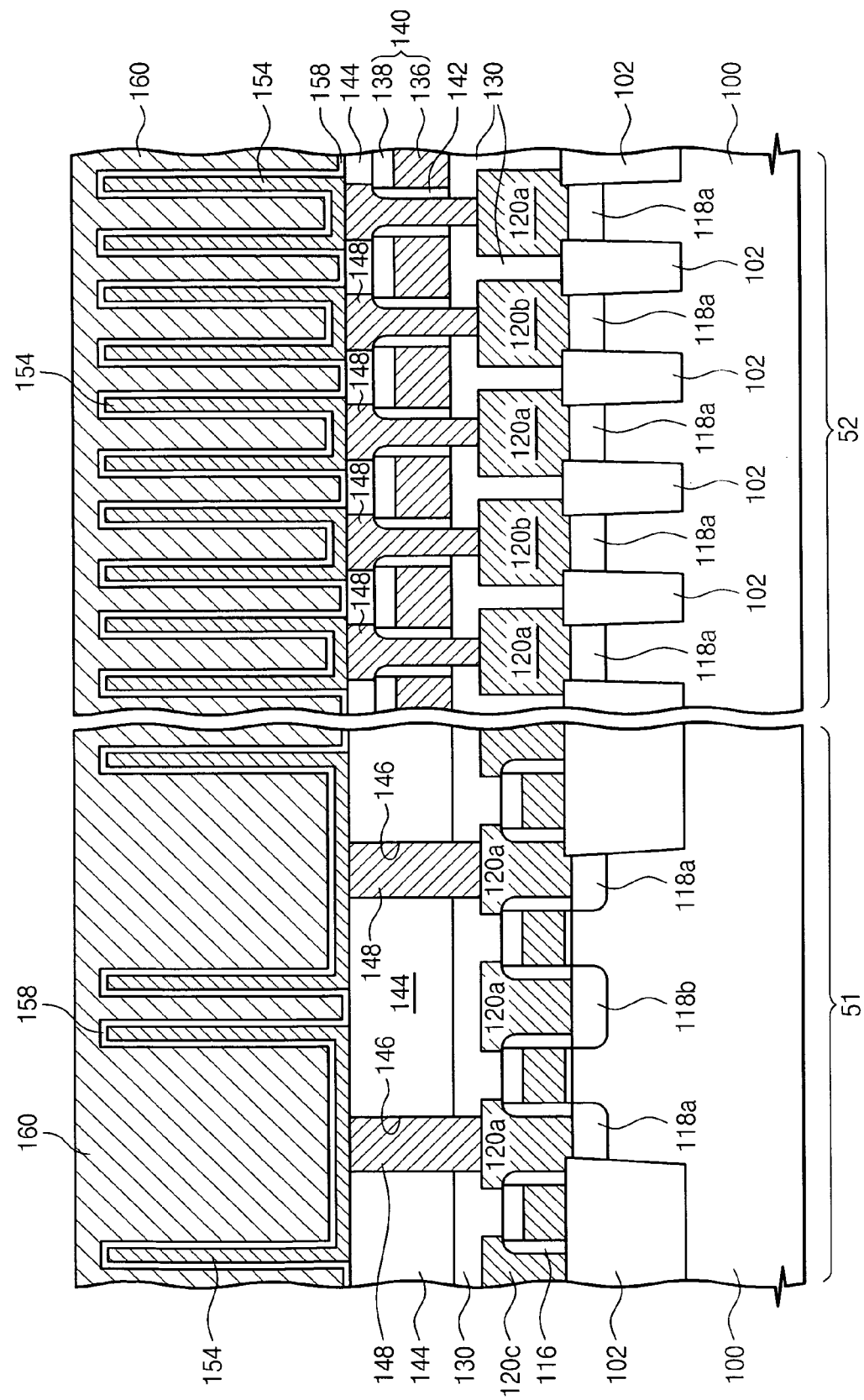

US 7,714,372 B2

DYNAMIC RANDOM ACCESS MEMORY DEVICES AND METHODS OF FORMING THE SAME

CROSS-REFERENCE TO RELATED APPLICATIONS

This application is related to and claims priority under 35 U.S.C. §119 to Korean Patent Application No. 10-2007-0017980, filed on Feb. 22, 2007, the entire contents of which ate hereby incorporated by reference.

BACKGROUND OF THE INVENTION

The present invention relates to semiconductor devices and methods of forming the same, and more particularly, to dynamic random access memory (DRAM) devices and methods of forming the same.

DRAM devices are generally able to be implemented with a high integration density as compared with static random access memory (SRAM) devices. As such, they are widely used for various products that need high capacity memory devices. A unit cell of a DRAM device generally includes a field effect transistor (hereinafter, referred to as a transistor), which is a switching device, and a capacitor for storing data. Due to ever increasing integration density of semiconductor devices, dimensions of DRAM cells are generally decreasing while a height thereof (relative to an underlying integrated circuit substrate on which the DRAM cell is formed) is increasing. Therefore, pads are typically used to provide electrical connections between relatively high position structures (e.g., a bit line and/or a capacitor) and relatively low position structures (e.g., a source/drain region of a transistor). The pads are typically disposed between the bit line or the capacitor and the source/drain region. Accordingly, an interval between the bit line or the capacitor and the source/drain region may be reduced, thereby decreasing an aspect ratio of a contact hole formed between the capacitor or the bit line and the source/drain. A conventional DRAM device will now be described further with reference to the accompanying drawings.

FIG. 1 is a plan view of a conventional DRAM device. Referring to FIG. 1, active regions 1 are two-dimensionally defined in an integrated circuit (e.g., semiconductor) substrate. The active regions 1 forming a pair of adjacent columns (corresponding to a direction from top to bottom in FIG. 1) are arranged in a zigzag pattern in order to minimize interference between structures formed thereon. A pair of gate lines 2 cross one active region 1 in parallel. The pair of gate lines 2 extend in the column direction and cross a plurality of active regions 1 forming one column.

A plurality of first pads 3 and a plurality of second pads 4 are disposed on the semiconductor substrate. The first pads 3 are connected to end portions of the active regions 1 at one side of the gate line 2 and the second pads 4 are connected to the active regions 1 between the pair of gate lines 2. A capacitor (not shown) is electrically connected to the first pads 3 and a bit line (not shown) is electrically connected to the second pads 4.

The first pads 3 form a first column and the second pads 4 form a second column. The first pads 3 of the first column respectively correspond to the active regions 1 forming the pair of columns and the second pads 4 of the second column respectively correspond to the active regions 1 forming the one column. In other words, a column of first pads 3 includes alternating pads contacting active regions 1 in adjacent columns. Therefore, the first pads 3 of the first column are arranged more closely to each other than the second pads 4 of the second column.

Because the first pads 3 of the first column are relatively closely disposed in the above-described DRAM device, an interval between the pair of adjacent first pads 3 may be the smallest of intervals that the first and second pads 3 and 4 form. Therefore, a conductive bridge may be generated between the first pads 3. That is, photoresist residues may remain between photoresist patterns for defining the first pads 3 due to narrow intervals, thereby generating the bridge therebetween during a photolithography process for defining the first and second pads 3 and 4. As semiconductor devices become more highly integrated, it generally becomes more difficult to form the first pads 3 closely and definitely without a bridge forming therebetween.

SUMMARY OF THE INVENTION

Some embodiments provide dynamic random access memory (DRAM) devices including first node pads and second node pads alternately arranged in a first direction on a substrate to form a first pad column. A width of the second node pads in a second direction, perpendicular to the first direction, is greater than a width of the first node pads in the second direction. Storage electrodes are electrically connected to the first node pads and the second node pads. Bit line pads may be arranged in the first direction on the substrate to form a second pad column. The second pad column is adjacent the first pad column and displaced therefrom in the second direction.

In other embodiments, adjacent ones of the first node pads and the second node pads are separated from each other by a first interval. Adjacent ones of the first node pads and the bit line pads are separated from each other by a second interval. Adjacent ones of the bit line pads are separated from each other by a third interval. The second and third intervals are larger than the first interval and no more than twice the first interval. Adjacent ones of the second node pads and the bit line pads may be separated from each other by a fourth interval that is substantially equal to the first interval. A width of the first node pads in the first direction may be substantially equal to a width of the second node pads in the first direction.

In further embodiments, the DRAM devices further include first active regions in the substrate and arranged with a predetermined pitch therebetween in the first direction to form a first column. Second active regions in the substrate are arranged in the first direction to form a second column adjacent the first column and displaced therefrom in the second direction. Each of the second active regions of the second column are located at a position displaced from a corresponding one of the first active regions by about ½ of the predetermined pitch in the first direction and by a predetermined distance in the second direction. The first node pads are connected to end portions of the first active regions proximate to the second column and the second node pads are connected to end portions of the second active region proximate to the first column. A second plurality of bit line pads are arranged in the first direction on the substrate to form another second pad column adjacent the first pad column on a side opposite from the second pad column. The second pad column and other second pad column define a pair of second pad columns. The bit line pads included in one of the pair of second pad columns are connected to predetermined regions of the first active regions and the bit line pads included in the other of the pair of second pad columns are connected to predetermined regions of the second active regions.

In other embodiments, the DRAM devices further include first source/drain regions disposed in end portions of the first active regions connected to the first node pads and in end portions of the second active regions connected to the second node pads, respectively. Second source/drain regions are in the first and second active regions connected to the bit line pads. Gate lines are provided crossing the first active region between the first and second source/drain regions and the second active regions between the first and second source/drain regions, respectively. Ech of the gate lines includes a gate insulating layer, a gate electrode on the gate insulating layer and a gate capping insulating pattern on the gate electrode. Gate insulating spacers are on sidewalls of the gate lines. Upper surfaces of the first node pads, the second node pads, and the bit line pads are higher than upper surfaces of the gate lines.

In further embodiments, the DRAM devices further include a first interlayer dielectric on the substrate that covers the first node pads, the second node pads, and the bit line pads. Bit line contact plugs extend through the first interlayer dielectric to contact corresponding ones of the bit line pads. Bit lines are disposed on the first interlayer dielectric and connected to corresponding ones of the bit line contact plugs. A second interlayer dielectric covers the bit lines and the first interlayer dielectric. Buried contact plugs extend through the second and first interlayer dielectrics and connect to corresponding ones of the first node pads or the second node pads. The storage electrodes are positioned on the second interlayer dielectric and are connected to corresponding ones of the buried contact plugs.

In further embodiments, the DRAM devices further include bit line insulating spacers on sidewalls of the bit lines. The bit lines include a conductive line pattern and a bit line capping insulating pattern on the conductive line pattern. The buried contact plugs are self-aligned with the bit line capping insulating pattern and the bit line insulating spacers. The buried contact plugs may be disposed substantially aligned on a straight line that extends in the first direction. The buried contact plugs connected to the first node pads may be disposed substantially aligned on a straight line that extends in the first direction and the buried contact plugs connected to the second node pads may be disposed substantially aligned on a second straight line extending parallel to the first straight line.

In other embodiments, the storage electrodes are disposed substantially aligned on a straight line that extends in the first direction. The storage electrodes connected to the first node pads may be disposed substantially aligned on a first straight line that extends in the first direction and the storage electrodes connected to the second node pads may be disposed substantially aligned on a second straight line extending parallel to the first straight line. The DRAM devices may further include a dielectric layer on surfaces of the storage electrodes and a plate electrode on the dielectric layer that covers surfaces of the storage electrodes.

In yet other embodiments, methods of forming a DRAM device include forming first node pads and second node pads alternately arranged in a first direction to form a first pad column. A width of the second node pads in a second direction perpendicular to the first direction is larger than a width of the first node pads in the second direction. Storage electrodes are formed electrically connected to the first node pads and the second node pads of the first pad column. Bit line pads may be formed arranged in the first direction on the substrate to form a second pad column. The second pad column is adjacent the first pad column and displaced therefrom in the second direction.

In further embodiments forming the first node pads and the second node pads and forming the bit line pads includes forming a pad conductive layer on the substrate, forming a first-mask layer on the pad conductive layer, patterning the first mask layer to form first node pad mask patterns arranged along the first pad column and bit line pad mask patterns arranged along the second pad column, forming a second mask layer on a surface of the substrate including the patterned first mask layer, forming second node pad mask patterns on the second mask layer that fill empty regions between adjacent pairs of the first node pad mask patterns, etching the second mask layer using the first node pad mask patterns, the second node pad mask patterns and the bit line pad mask patterns as an etch mask to expose the pad conductive layer between the first node pad mask patterns, the second node pad mask patterns, and the bit line pad mask patterns and etching the exposed pad conductive layer to form the first node pads, the second node pads and the bit line pads.

In further embodiments, an interval between adjacent ones of the first node pad mask patterns and bit line pad mask patterns and an interval between adjacent ones of the bit line pad mask patterns are greater than a thickness of the second mask layer and no greater than twice the thickness of the second mask layer. An interval between the second node pad mask pattern and the bit line pad mask pattern adjacent thereto and an interval between the first and second node pad mask patterns adjacent to each other may be equal to the thickness of the second mask layer. Forming the first mask layer may be preceded by forming a hard mask layer having an etch selectivity with respect to the pad conductive layer on the pad conductive layer and etching the second mask layer may include successively etching the second mask layer and the hard mask layer using the first node pad mask patterns, the second node pad mask patterns, and the bit line pad mask patterns as a mask.

In other embodiments, forming the first node pads and the second node pads and forming the bit line pads is preceded by forming a device isolation layer on the substrate that defines first active regions arranged with a predetermined pitch in the first direction to form a first column and second active regions adjacent a side of the first column and displaced therefrom in the second direction on the substrate that are arranged in the first direction to form a second column. Each of the second active regions of the second column are located at a position displaced from a corresponding one of the first active regions by about ½ of the predetermined pitch in the first direction and by a predetermined distance in the second direction. The first node pads are connected to end portions of the first active regions adjacent to the second column and the second node pads are connected to end portions of the second active region adjacent to the first column. Forming bit line pads includes forming a second plurality of bit line pads arranged in the first direction on the substrate to form another second pad column adjacent the first pad column on a side opposite from the second pad column. The second pad column and other second pad column defining a pair of second pad columns. The bit line pads included in one of the pair of second pad columns are connected to predetermined regions of the first active regions and the bit line pads included in the other of the pair of second pad columns are connected to predetermined regions of the second active regions.

In yet further embodiments, forming the first node pads and the second node pads and forming the bit line pads are preceded by forming gate lines crossing the first active regions and second active regions and injecting dopant ions into the first and second active regions using the gate lines as a mask to form first and second source/drain regions. Gate insulating spacers are formed on sidewalls of the gate lines. The first source/drain regions are formed in end portions of the first and second active regions connected to the first and second node pads. The second source/drain regions are formed in the first and second active regions connected to the bit line pads.

In other embodiments, forming the storage electrodes is preceded by forming a first interlayer dielectric on the substrate that covers the first node pads, the second node pads, and the bit line pads and forming bit line contact plugs extending through the first interlayer dielectric to contact the bit line pads. Bit lines are formed connected to the bit line contact plugs on the first interlayer dielectric. A second interlayer dielectric is formed on an upper surface of the substrate. Buried contact plugs are formed extending through the second and first interlayer dielectrics to contact the first and second node pads. The storage electrodes are formed on the second interlayer dielectric and contacting the buried contact plugs.

In further embodiments, centers of the buried contact plugs connected to the first node pads are on a first straight line that extends in the first direction and centers of the buried contact plugs connected to the second node pads are on a second straight line extending parallel to the first straight line. Centers of the storage electrodes connected to the first node pads may be on a first straight line that extends in the first direction and centers of the storage electrodes connected to the second node pads may be disposed on a second straight line extending parallel to the first straight line.

BRIEF DESCRIPTION OF THE DRAWINGS

The above and other aspects, features and advantages of the present invention will be more apparent from the following detailed description taken in conjunction with the accompanying drawings, in which:

FIGS. 2A through 9A are plan views of a DRAM device according to some embodiments of the present invention;

FIGS. 2B through 9B are cross-sectional views taken along lines I-I' II-II' of FIGS. 2A through 9A, respectively;

DETAILED DESCRIPTION OF EMBODIMENTS

Figure 1:
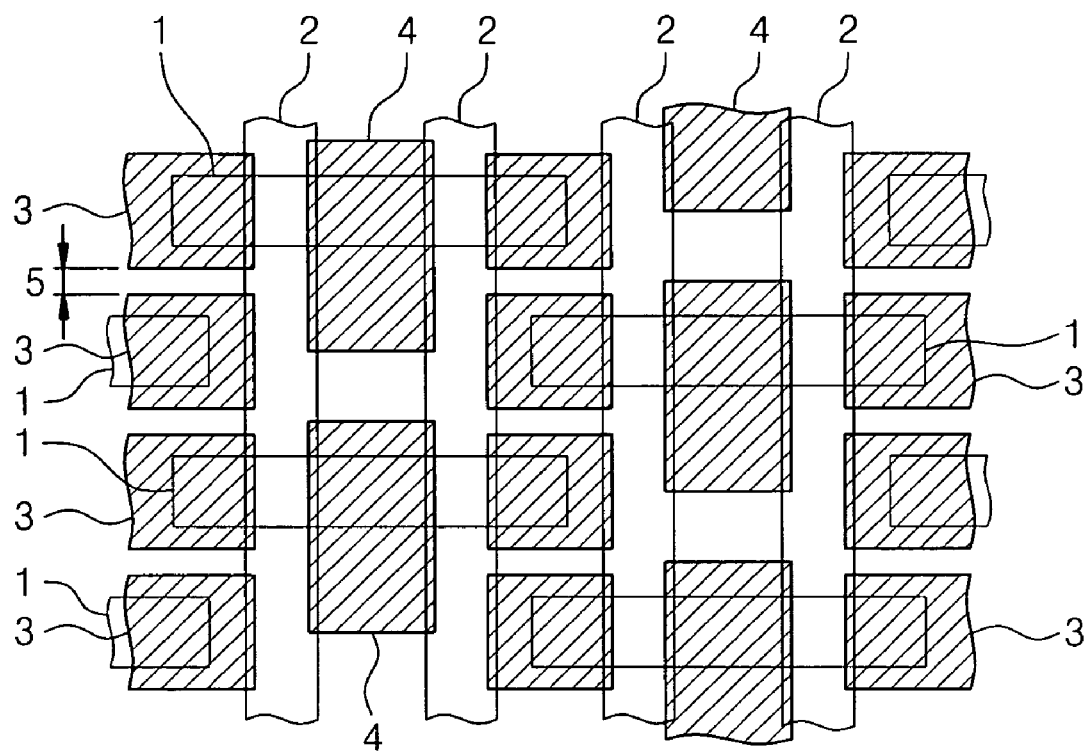
FIG. 1 is a plan view of a conventional DRAM device.

The present invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

FIGS. 2A through 9A are plan views of a DRAM device according to some embodiments of the present invention and FIGS. 2B through 9B are cross-sectional views taken along lines I-I' and II-II' of FIGS. 2A through 9A, respectively.

Figure 2A:
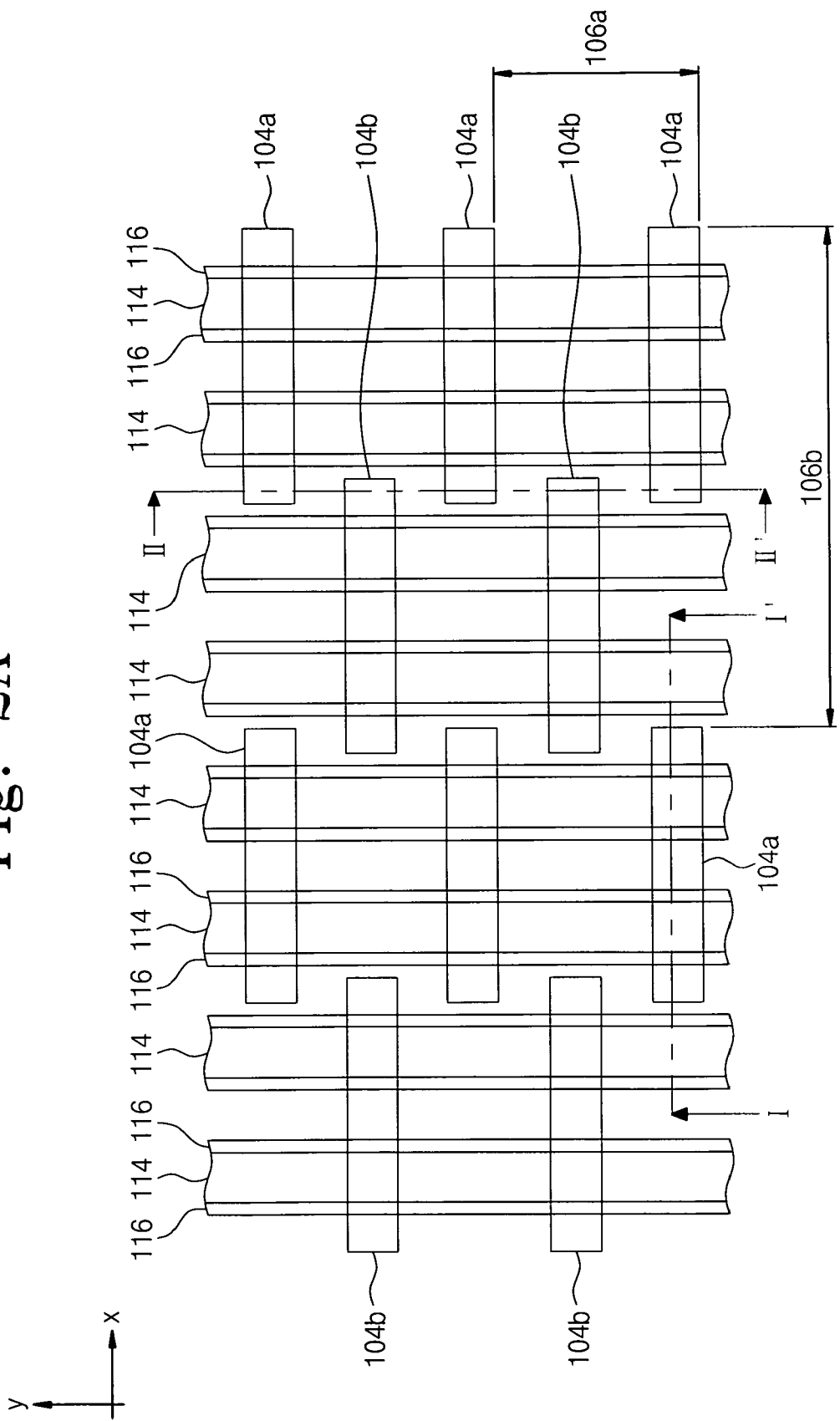
Figure 2B:
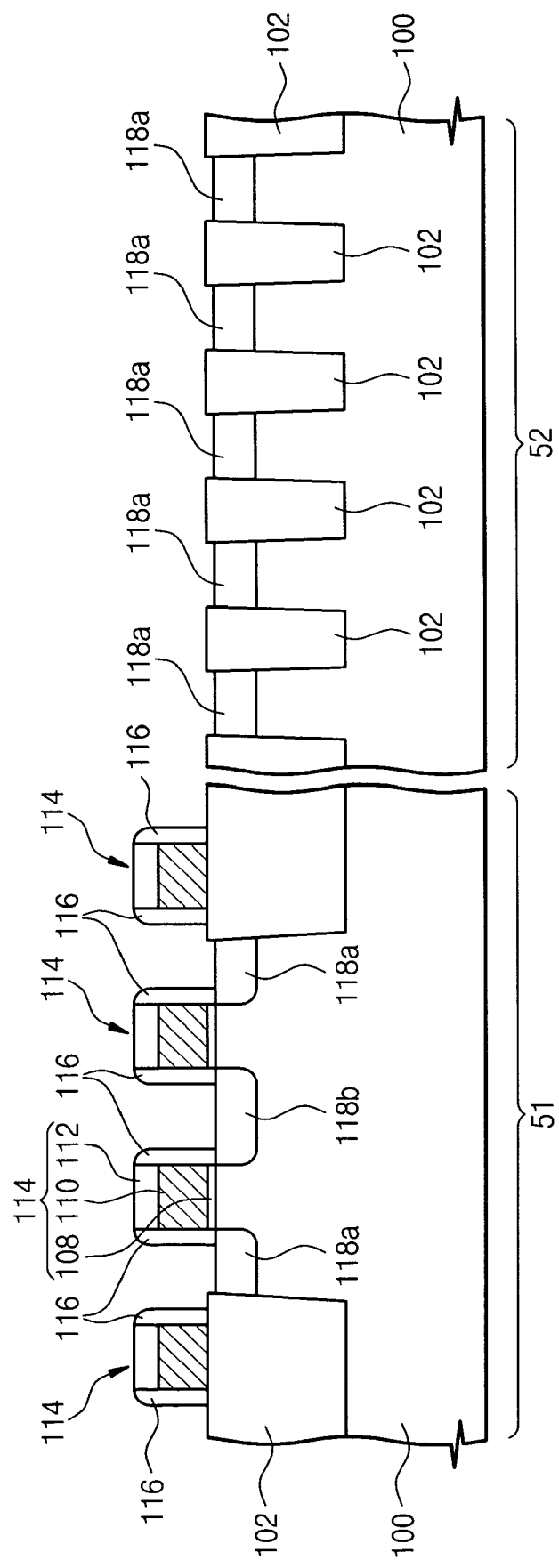

FIGS. 2A and 2B illustrate transistors formed in a cell array of a DRAM device. Referring to FIGS. 2A and 2B, a device isolation layer 102 is formed on an integrated circuit substrate (hereinafter, referred to as a substrate) 100 to define first active regions 104a and second active regions 104b. The first active regions 104a are arranged two-dimensionally to form first rows and first columns. A direction parallel to the first column is referred to herein as a first direction and a direction parallel to the first row is referred to herein as a second direction. In other words, the first direction corresponds to a y-axis and the second direction corresponds to an x-axis as shown in FIG. 2A. The first active regions 104a include a first pitch 106a in the first direction (that is, a column direction) and a second pitch 106b in the second direction (that is, a row direction). The second active regions 104b are respectively located at positions where the first active regions 104a are moved by ½ of the first pitch 106a in the first direction and by ½ of the second pitch 106b in the second direction. The second active regions 104b are arranged two-dimensionally along second rows and second columns. That is, the first columns that the first active regions 104a form and the second columns that the second active regions 104b form are alternately arranged in the second direction. In the adjacent first and second columns, the second active regions 104b of the second column are separated from the first active regions 104a of the first column by ½ of the first pitch 106a in the first direction.

Gate lines 114 are formed on the substrate 100 so as to cross the first and second active regions 104a and 104b. The gate lines 114 are arranged parallel to each other. A pair of gate lines 114 cross the first active regions 104a of the first column. Another pair of gate lines 114 cross the second active regions 104b of the second column.

The illustrated gate lines 114 each include a gate insulating layer 108, a gate electrode 110, and a gate capping insulating pattern 112 that are sequentially stacked. The gate insulating layer 108 may include an oxide layer, for example, a thermal oxide layer. The gate electrode 110 is formed of a conductive material. For example, the gate electrode 110 may include doped polysilicon, a metal (for example, tungsten, molybdenum, and/or the like), a conductive metal nitride (for example, nitride titanium, nitride tantalum, and/or the like) and/or a metal silicide (for example, tungsten silicide, cobalt silicide, and/or the like). The gate capping insulating pattern 112 may include an oxide layer, a nitride layer and/or an oxide nitride layer.

Dopant ions are injected into the first and second active regions 104a and 104b, using the gate lines 114 as a mask, to form first source/drain regions 118a and second source/drain regions 118b. The first source/drain regions 118a are formed at both end portions of the first active regions 104a and both end portions of the second active regions 104b, respectively. The second source/drain regions 118b are formed in the first active regions 104a between the pair of gate lines 114 and the second active regions 104b between another pair of gate lines 114, respectively.

Gate insulating spacers 116 are formed at both sidewalls of the gate lines 114. The gate insulating spacers 116 cover sidewalls of the gate electrode 110. That is, the gate electrode 110 is surrounded by the gate capping insulating pattern 112 and the gate insulating spacers 116. The gate insulating spacers 116 may include an oxide layer, a nitride layer and/or an oxide nitride layer.

Figure 10:
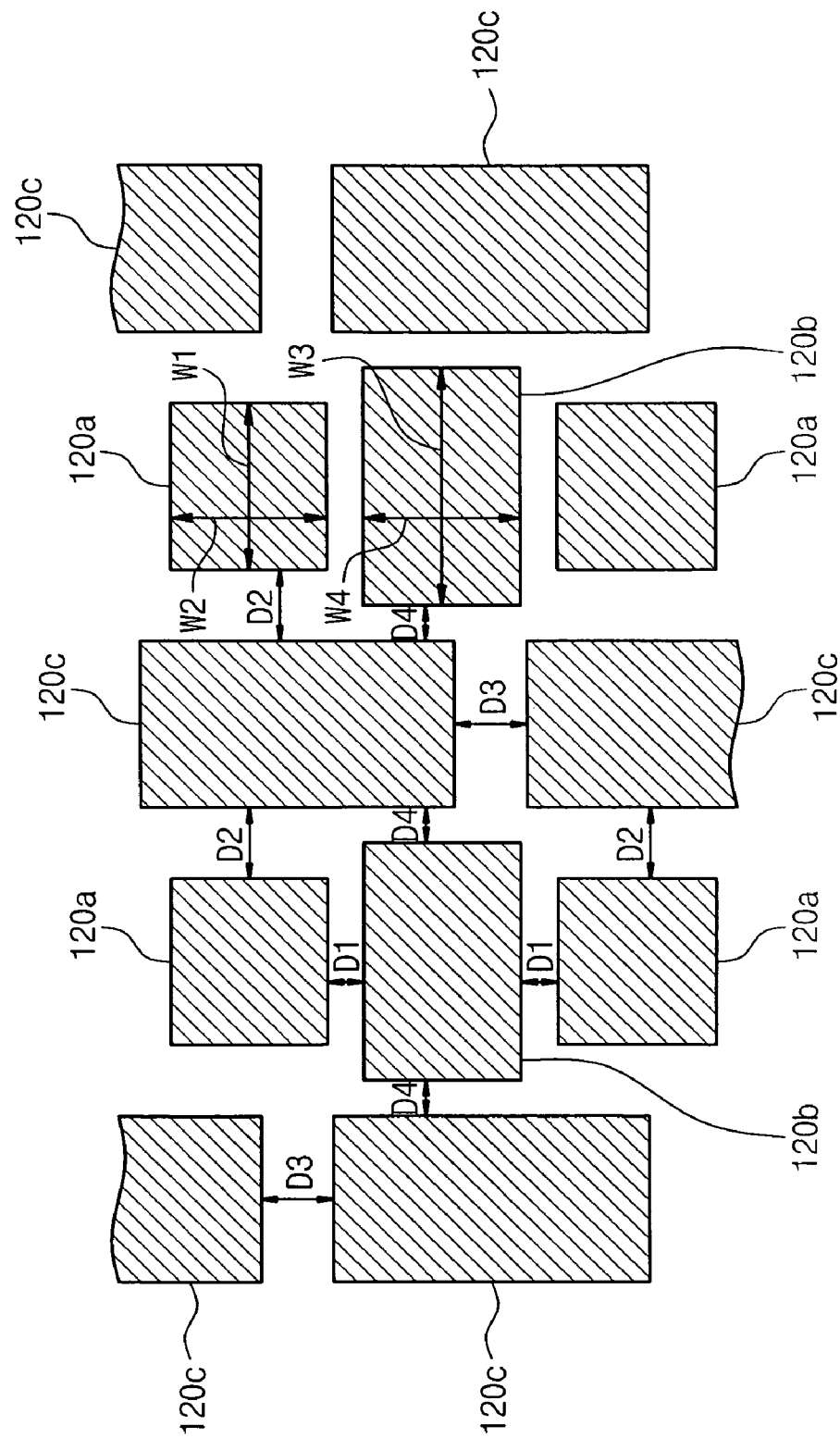
FIG. 10 is an enlarged plan view of pads illustrated in section "A" of FIG. 6A.

Next, a method of forming pads in the DRAM device of FIG. 2A according to some embodiments will be described with reference to FIGS. 3A through 6B and 10. FIG. 10 is an enlarged plan view of pads illustrated in a section "A" of FIG. 6A.

Figure 3B:
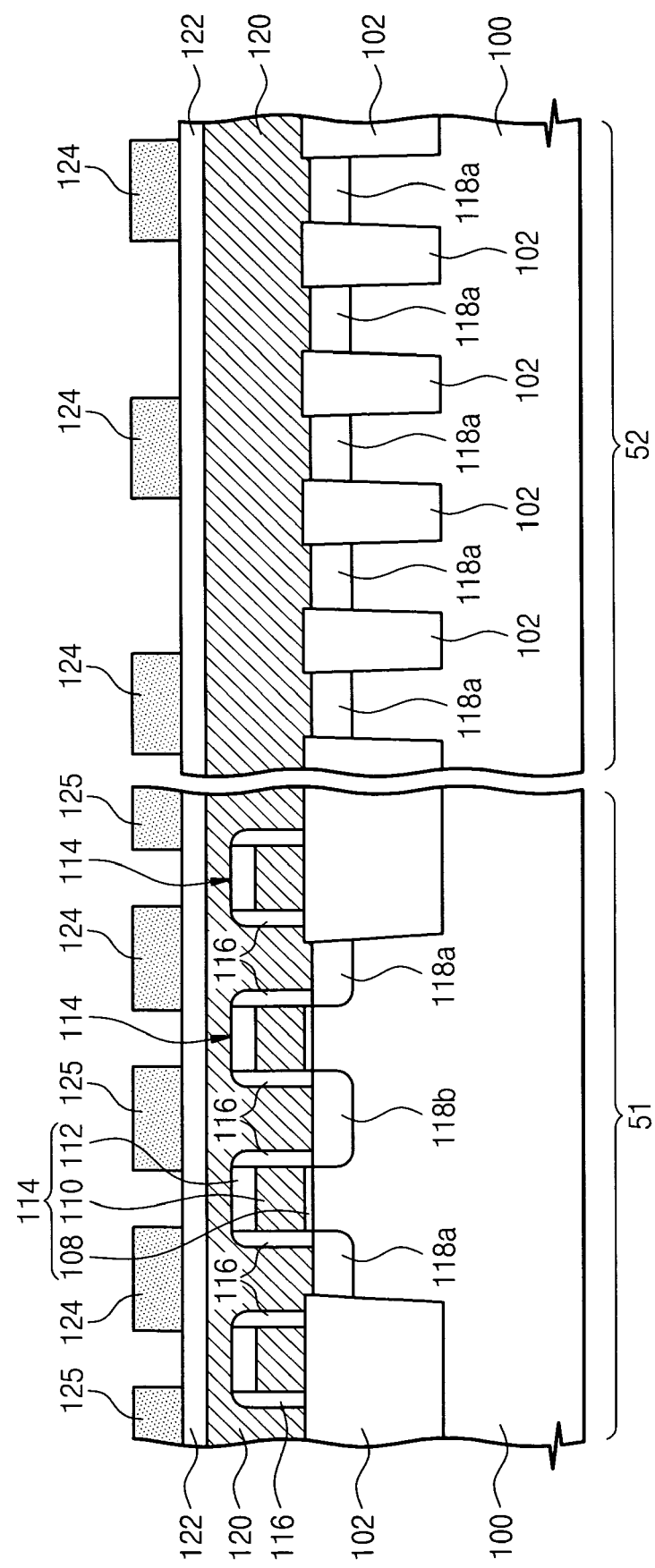

Referring first to FIGS. 3A and 3B, a pad conductive layer 120 is formed on the substrate 100 including the gate lines 114 and the gate insulating spacers 116. The pad conductive layer 120 contacts the first and second source/drain regions 118a and 118b. As the gate electrode 110 is surrounded by the gate capping insulating pattern 112 and the gate insulating spacers 116, the pad conductive layer 120 is insulated from the gate electrode 110. The pad conductive layer 120 may be formed, for example, of doped polysilicon.

A hard mask layer 122 may be formed on the pad conductive layer 120. The hard mask layer 122 is formed of a material having an etch selectivity with respect to the pad conductive layer 120. The hard mask layer 122 may not be formed in some embodiments.

A first mask layer is formed on the hard mask layer 122 and then patterned to form first node mask patterns 124 and bit line pad mask patterns 125. The first mask layer may be formed of a material having an etch selectivity with respect to the hard mask layer 122. If the hard mask layer 122 is not formed, the first mask layer may be formed of a material having an etch selectivity with respect to the pad conductive layer 120.

The first node pad mask patterns 124 are arranged in the first direction to form a first pad column. The bit line pad mask patterns 125 are arranged in the first direction to form a second pad column. The second pad column is disposed at one side of the first pad column. A plurality of first pad columns and a plurality of second pad columns are alternately arranged in the second direction. As such, a pair of second pad columns are disposed at both sides of ones of the first pad columns, respectively.

The first node pad mask patterns 124 of the first pad column cover end portions of the first active regions 104a of the first column, respectively. That is, the first node pad mask patterns 124 of the first pad column cover the first source/drain regions 118a formed at end portions of the first active regions 104a, respectively. The first node pad mask patterns 124 of a pair of adjacent first pad columns cover the first source/drain regions 118a formed at both end portions of the first active regions 104a of the first columns, respectively.

The bit line pad mask patterns 125 are disposed over the second source/drain regions 118b formed in the first active regions 104a and the second active regions 104b, respectively. That is, the bit line pad mask patterns 125 of one of a pair of second pad columns disposed at both sides of the first pad column cover the second source/drain regions 118b formed in the first active regions 104a of the first column, respectively, and the bit line pad mask patterns 125 of the other one of the pair of second pad columns cover the second source/drain regions 118b formed in the second active regions 104b of the second column, respectively. In some embodiments, when the first mask layer is patterned, mask patterns that cover the first source/drain regions 118a formed in the second active regions 104b are not formed.

Figure 4A:
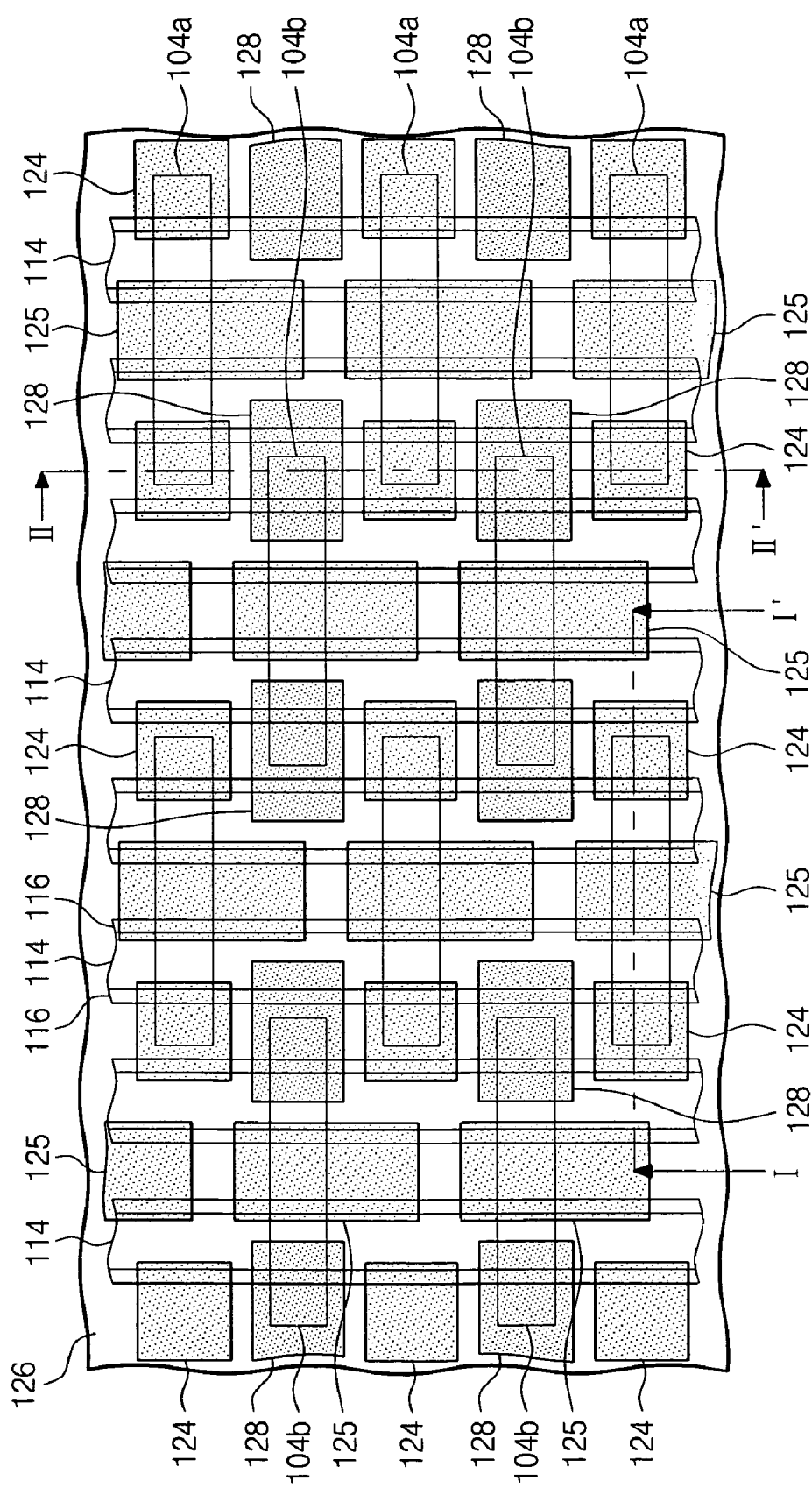
Figure 4B:
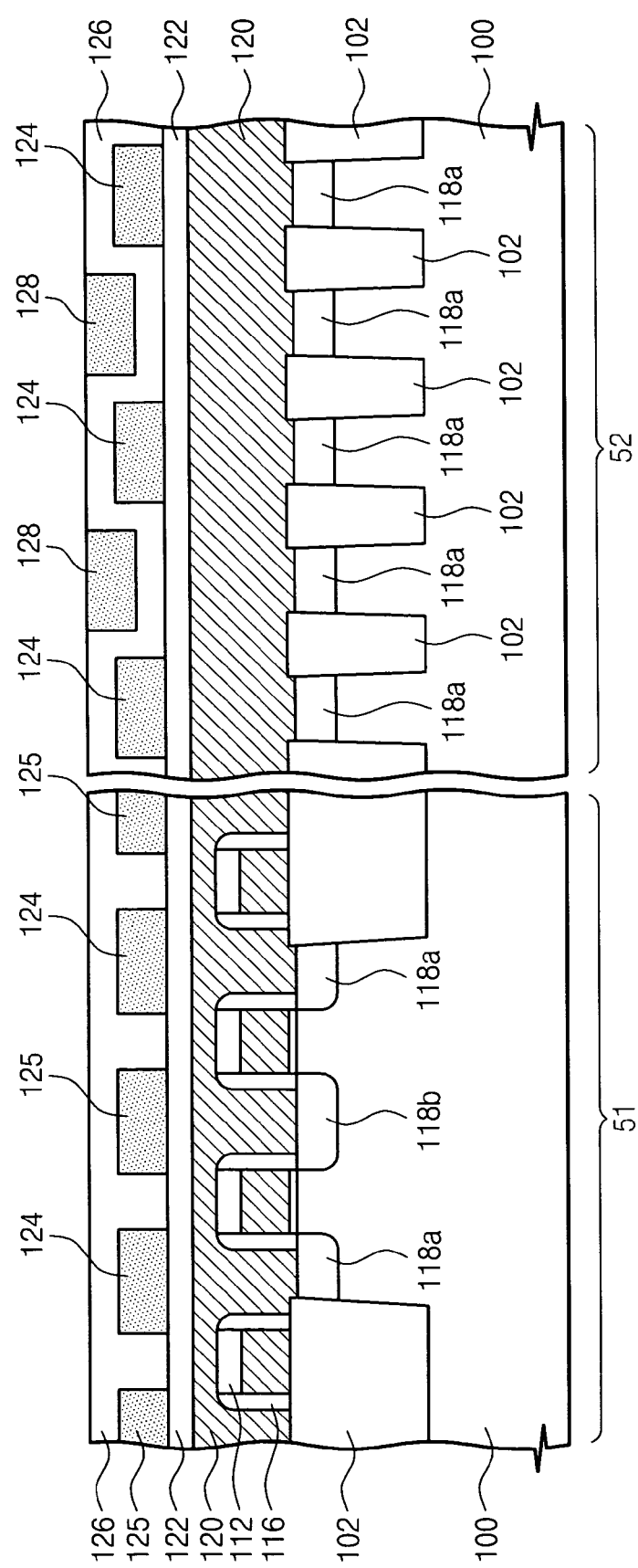

Referring to FIGS. 4A and 4B, a second mask layer 126 is shown formed substantially conformally on the substrate 100 including the first node pad mask patterns 124 and the bit line pad mask patterns 125. The second mask layer 126 may be formed to have substantially uniform thinkness on upper surfaces and sidewalls of the first node pad mask patterns 124 and upper surfaces and sidewalls of the bit line pad mask patterns 125.

A third mask layer is formed on the second mask layer 126 so as to fill empty regions between the first node pad mask patterns 124 adjacent to each other. Sidewalls and bottom surfaces of the empty regions are formed of the second mask layer 126. The second mask layer 126 that forms the sidewalls of the empty regions is formed on the sidewalls of the adjacent first node pad mask patterns 124 and the sidewalls of the adjacent bit line pad mask patterns 125. The empty regions are isolated from each other.

The second mask layer 126 is formed of a material having an etch selectivity with respect to the first and third mask layers. The first and third mask layers may be the same material as each other. For example, the hard mask layer 122 may include an oxide layer, the first and third mask layers may be formed of polysilicon, and the second mask layer 126 may include an oxide layer. If the hard mask layer 122 is not formed, the first and third mask layers may include a nitride layer or an oxynitride layer having an etch selectivity with respect to the pad conductive layer 120 and the second mask layer 126 may include an oxide layer.

The third mask layer is planarized until the second mask layer 126 on upper surfaces of the first node and bit line pad mask patterns 124 and 125 is exposed to form second node pad mask patterns 128 that fill the empty regions, respectively. The second node pad mask patterns 128 are included in the first pad column. That is, the first and second node pad mask patterns 124 and 128 are alternately disposed in the first direction to form the first pad column. The second node pad mask patterns 128 of the first pad column cover the first source/drain regions 118a formed at end portions of the second active regions 104b of the second column. That is, the first and second node pad mask patterns 124 and 128 of the first pad column cover the first source/drain regions 118a formed at end portions of the first and second active regions 104a and 104b adjacent to each other.

An interval between the pair of adjacent first node pad mask patterns 124 is larger than twice the thickness of the second mask layer 126. In some embodiments, the interval between the pair of adjacent first node pad mask patterns 124 is substantially equal to the sum of twice the thickness of the second mask layer 126 and a width of the second node pad mask pattern in the first direction. An interval between the first node pad mask pattern 124 and the bit line pad mask pattern 125 adjacent to each other, and an interval between the pair of bit line pad mask pattern 125 adjacent to each other may be larger than the thickness of the second mask layer 126 and equal to or smaller than twice the thickness of the second mask layer 126. Therefore, the second mask layer 126 fills a region between the first node pad mask pattern 124 and the bit line pad mask pattern 125 adjacent to each other and a region between the pair of adjacent bit line pad mask patterns 125. As a result, the empty regions may be isolated from each other and the second node pad mask patterns 128 are formed such that they are isolated from each other.

An interval between the first and second node pad mask patterns 124 and 128 adjacent to each other, and an interval between the second node pad mask pattern 128 and the bit line pad mask pattern 125 adjacent to each other are determined depending on the thickness of the second mask layer 126 and are substantially equal to each other.

Figure 5A:
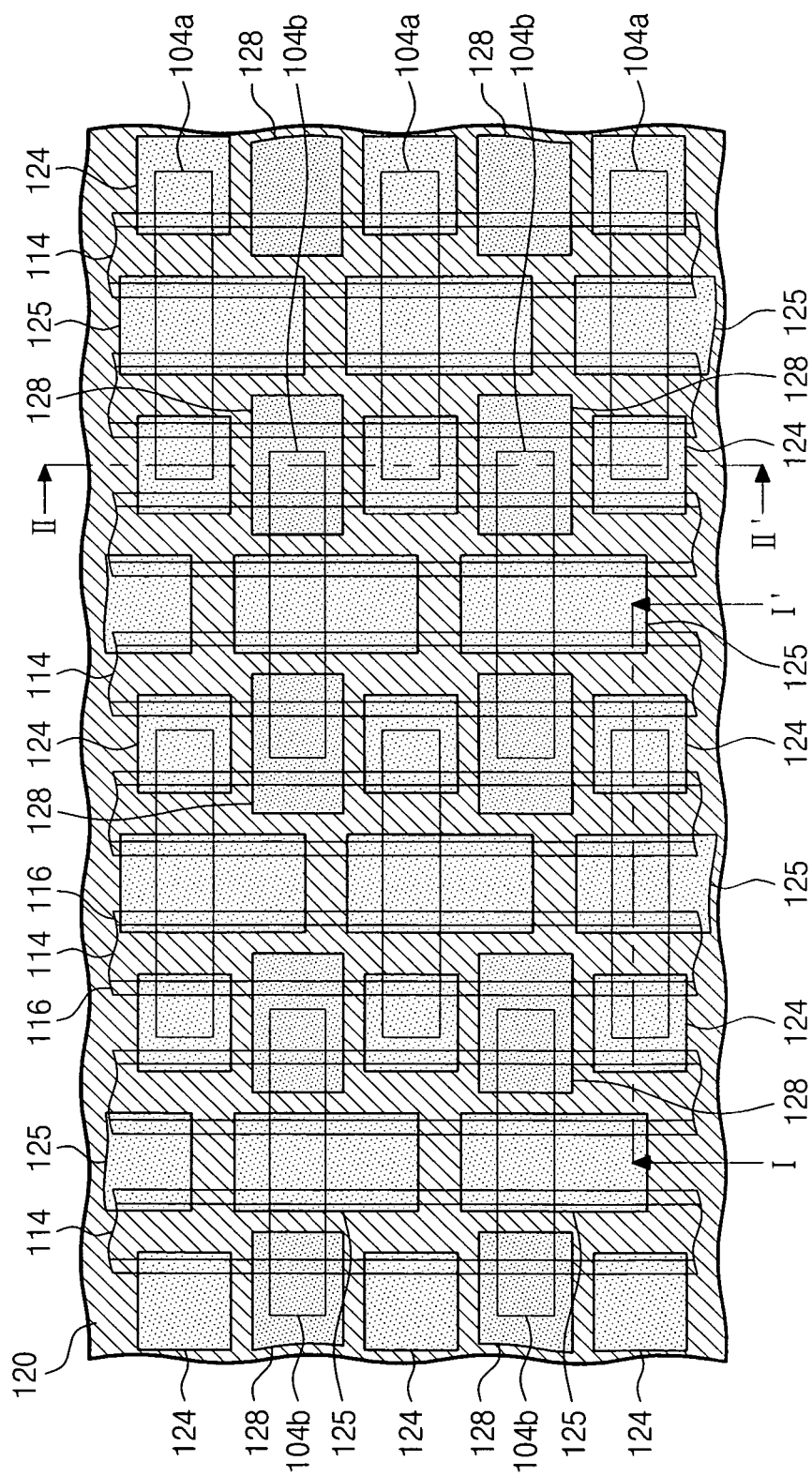
Figure 5B:
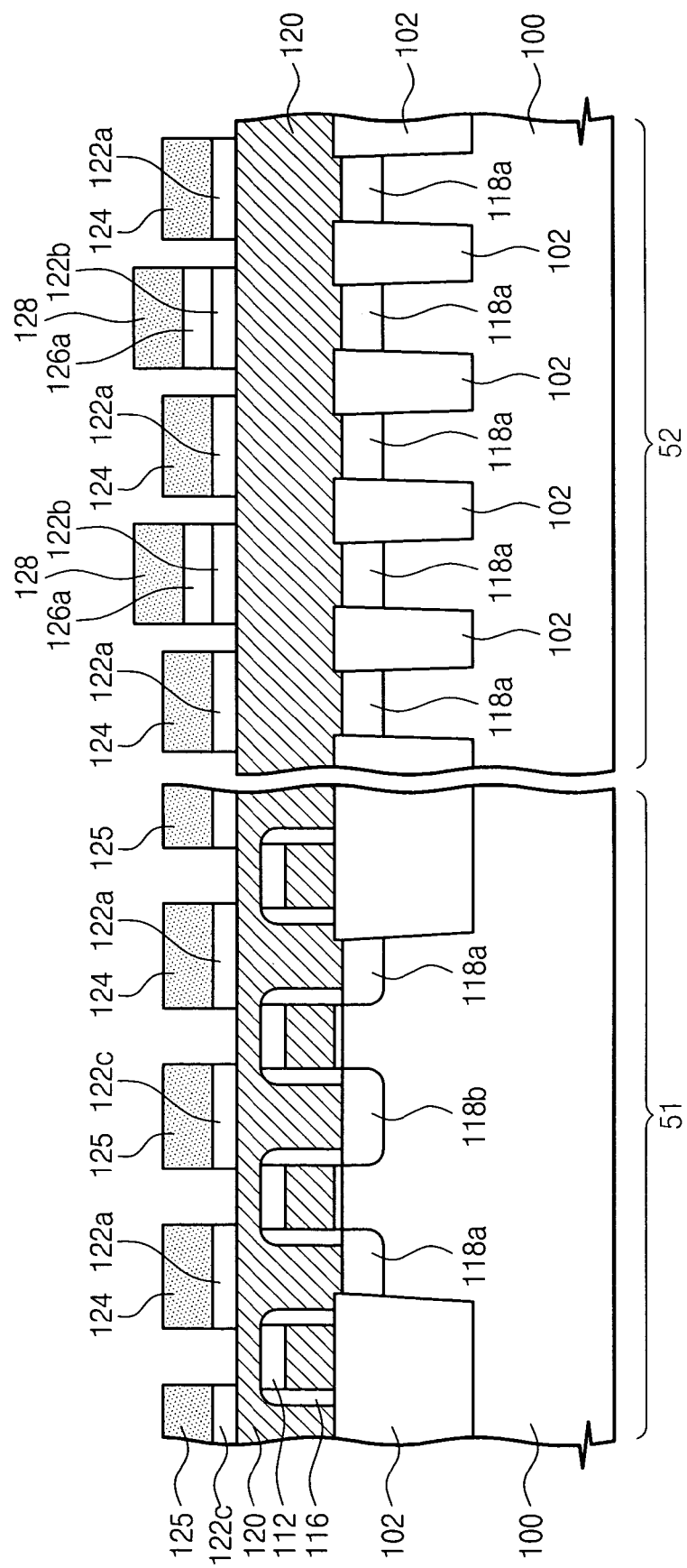

Referring to FIGS. 5A and 5B, the second mask layer 126 and the hard mask layer 122 are successively etched using the first node pad, the second node pad, and the bit line pad mask patterns 124, 128 and 125 as an each mask. Therefore, the pad conductive layer 120 between the first node pad, the second node pad, and the bit line pad mask patterns 124, 128 and 125 is exposed. A first hard mask pattern 122a is formed under the first node pad mask pattern 124, a second hard mask pattern 122b is formed under the second node pad mask pattern 128, and a third hard mask pattern 122c is formed under the bit line pad mask pattern 125 through the etching process. A residual pattern 126a is formed between the second node pad mask pattern 128 and the second hard mask pattern 122b. The residual pattern 126a is a remaining portion of the second mask layer 126.

Figure 6A:
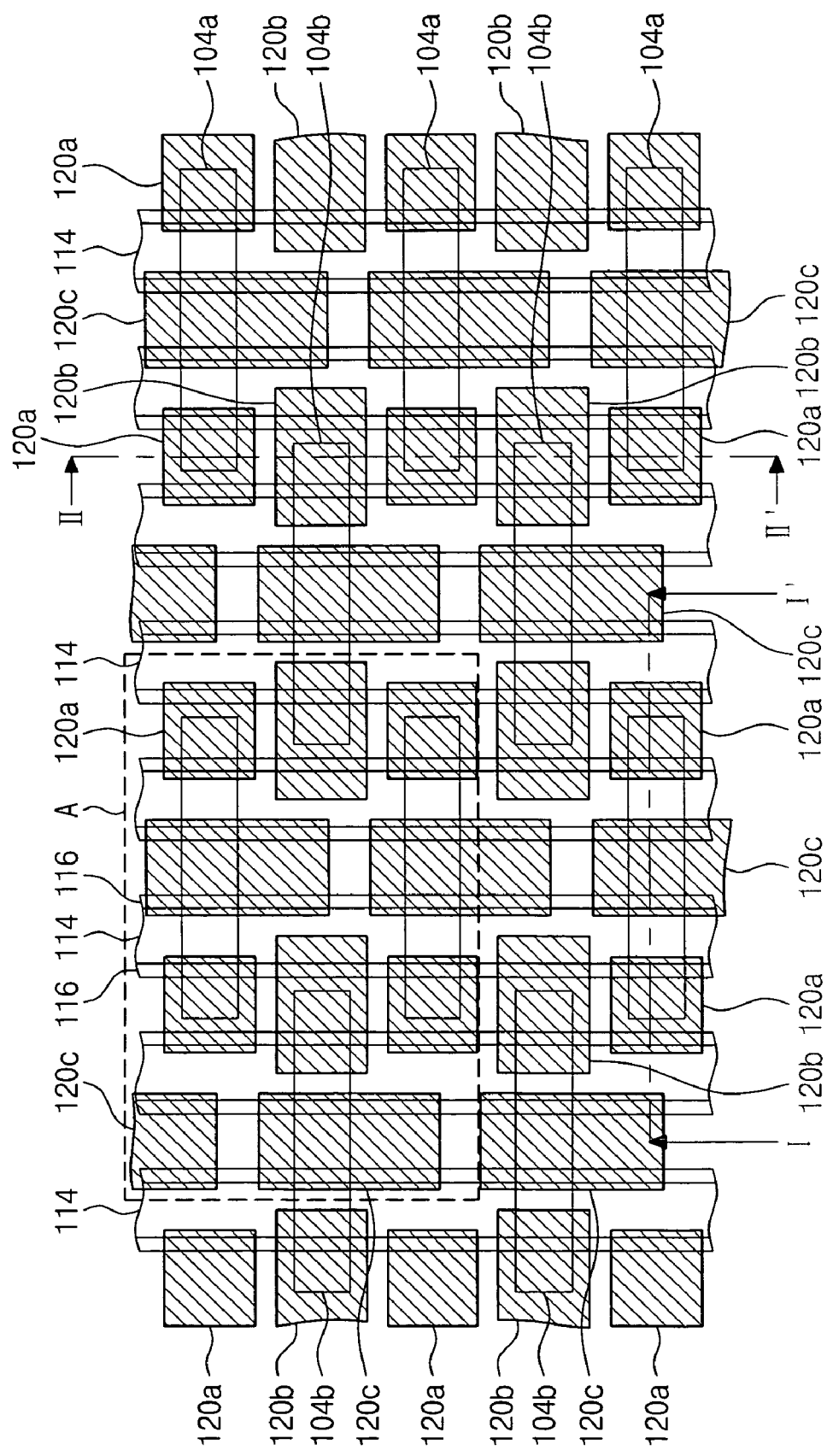
Figure 6B:
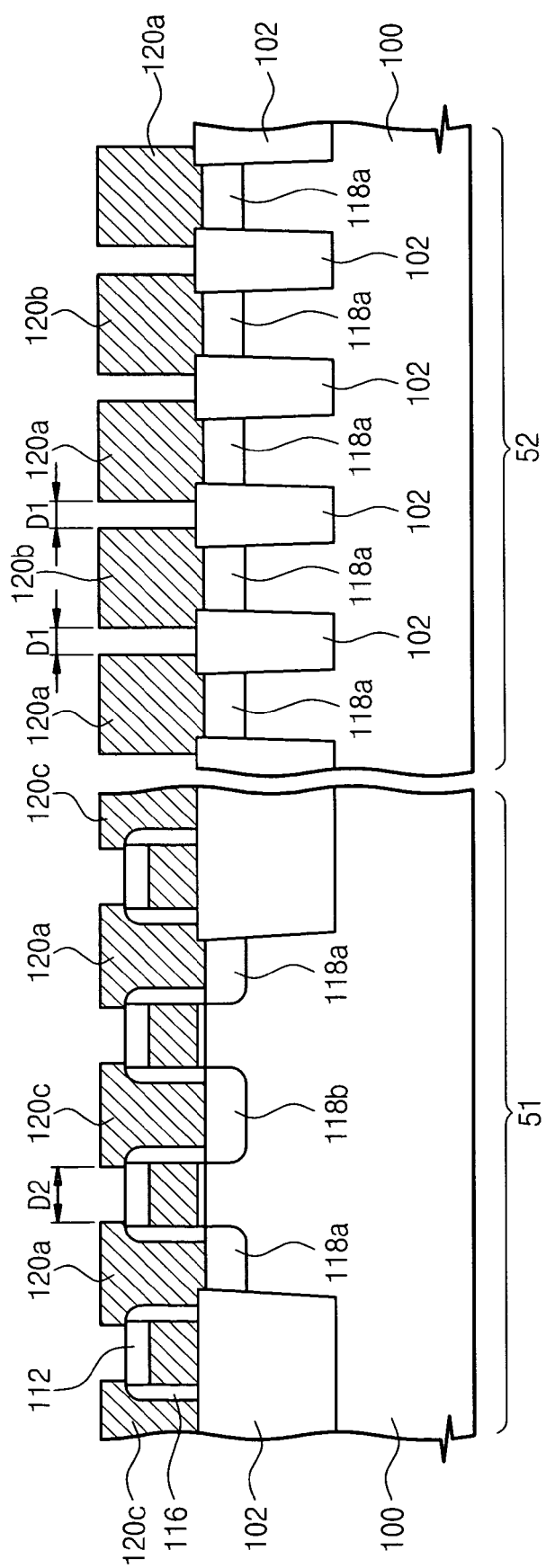

Referring to FIGS. 6A and 6B, the pad conductive layer 120 is etched using the first node pad, the second node pad, and the bit line pad mask patterns 124, 128 and 125 as a mask to form first node pads 120a, second node pads 120b, and bit line pads 120c. The first node, the second node, and the bit line pads 120a, 120b and 120c are defined by the first node pad, the second node pad, and the bit line pad mask patterns 124, 128 and 125, respectively.

If the mask patterns 124, 128 and 125 are formed of polysilicon, the mask patterns 124, 128 and 125 may be etched in the etching of the pad conductive layer 120. In this case, the first, second and third hard mask patterns 122a, 122b and 122c may substantially serve as an etch mask for protecting the pads 120a, 120b and 120c. If the hard mask patterns 122a, 122b and 122c are not formed, the mask patterns 124, 128 and 125 may include a nitride layer or an oxide nitride layer having an etch selectivity with respect to the pad conductive layer 120 so as to substantially serve as an etch mask. After the forming of the first node, the second node, and the bit line pads 120a, 120b and 120c, the mask patterns 124, 128 and 125, the residual pattern 126a, and the hard mask patterns 122a, 122b and 122c are removed.

The pads 120a, 120b and 120c will now be further described with reference to FIG. 10. Referring to FIGS. 6A, 6B, and 10, a plurality of the first node pads 120a and a plurality of the second node pads 120b are alternately arranged in the first (column) direction on the substrate 100 to form the first pad column. A plurality of the bit line pads 120c are arranged in the first direction to form the second pad column. As described above, the second pad column is disposed at one side of the first pad column.

A plurality of the first pad columns and a plurality of the second pad columns are alternately arranged in the second (row) direction. Therefore, a pair of the second pad columns are disposed at respective sides of the first pad column.

As shown in FIG. 10 for respective adjacent ones of the pads, the first node pad 120a and the second node pad 120b adjacent to the first node pad 120a are separated from each other by a first interval (distance) D1, the first node pad 120a and the bit line pad 120c adjacent to the first node pad 120a are separated from each other by a second interval D2, and a pair of adjacent bit line pads 120c are separated from each other by a third interval D3. The second node pad 120b and the bit line pad 120c adjacent to the second node pad 120b are separated from each other by a fourth interval D4. In the illustrated embodiments, the second and third intervals D2 and D3 are larger than the first interval D1 and are equal to or smaller than twice the first interval D1. The first interval D1 is substantially equal to the fourth interval D4. The first and fourth intervals D1 and D4 are substantially equal to the thickness of the second mask layer 126 in some embodiments.

The illustrated first node pad 120a has a first width W1 in a direction (that is, the second (row) direction) perpendicular to the first pad column and a second width W2 in a direction (that is, the first (column) direction) parallel to the first pad column. The second node pad 120b has a third width W3 in the second direction and a fourth width W4 in the first direction. In the illustrated embodiments, the third width W3 of the second node pad 120b is larger than the first width W1 of the first node pad 120a. This is because the second interval D2 is larger than the fourth interval D4. The second width W2 of the first node pad 120a may be equal to the fourth width W4 of the second node pad 120b.

As seen in FIGS. 6A and 6B, the first node pad 120a is connected to the first source/drain region 118a formed at one end portion of the first active region 104a. The second node pad 120b is connected to the first source/drain region 118a formed at one end portion of the second active region 104b. That is, the first and second node pads 120a and 120b of the first pad column are disposed at a center portion of the adjacent first and second columns, the first node pads 120a of the first pad column are connected to the first source/drain regions 118a formed at end portions of the first active regions adjacent to the second column, and the second node pads 120b of the first pad column are connected to the first source/drain regions 118a formed at end portions of the second active regions 104b adjacent to the first column. The bit line pads 120c of the pair of second pad columns disposed at both sides of the first pad column are connected to the second source/drain regions 118b formed in the first and second active regions 104a and 104b, respectively.

The first node, the second node, and the bit line pads 120a, 120b and 120c are self-aligned with the gate insulating spacer 116. That is, during the etching process using the mask patterns 124, 128 and 125 as a etch mask, the pads 120a, 120b and 120c are self-aligned with at least the gate insulating spacer 116. The pads 120a, 120b and 120c may cover some portion of the gate capping insulating pattern 112.

As described above, based on the structural characteristics of the pads 120a, 120b and 120c and the method of forming the pads, the first node pad mask patterns 124 and the bit line pad mask patterns 125 are formed in the patterning of the first mask layer. At this time, the intervals between the first node and bit line pad mask patterns 124 and 125 are larger than the first interval D1 between the first and second node pads 120a and 120b. Therefore, a process margin may be improved in the photolithography process of defining the first node pad mask patterns 124 and the bit line pad mask patterns 125.

In addition, the second node pad mask patterns 128 may be formed to be self-aligned by the second mask layer 126 and the third mask layer. As a result, a photolithography process for forming the second node pad mask patterns 128 may not be required. Therefore, the productivity of the method may be improved and a desired process margin of the photolithography process can be obtained. As a result, the process margin of the photolithography process may be obtained and first and second node pads 120a and 120b having small intervals may be formed by the above described method of forming the pads 120a, 120b and 120c.

Figure 7A:
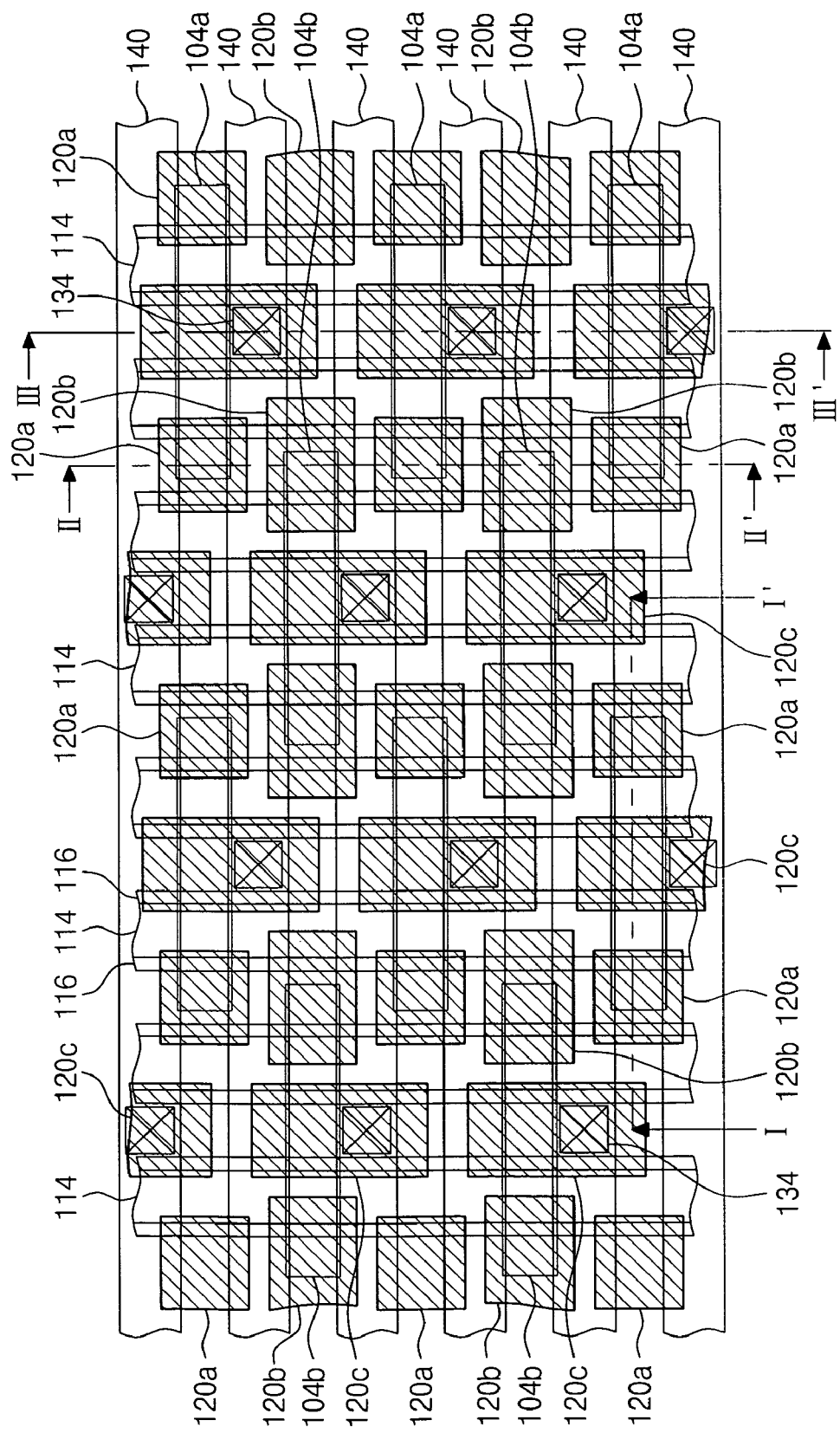
Figure 11:
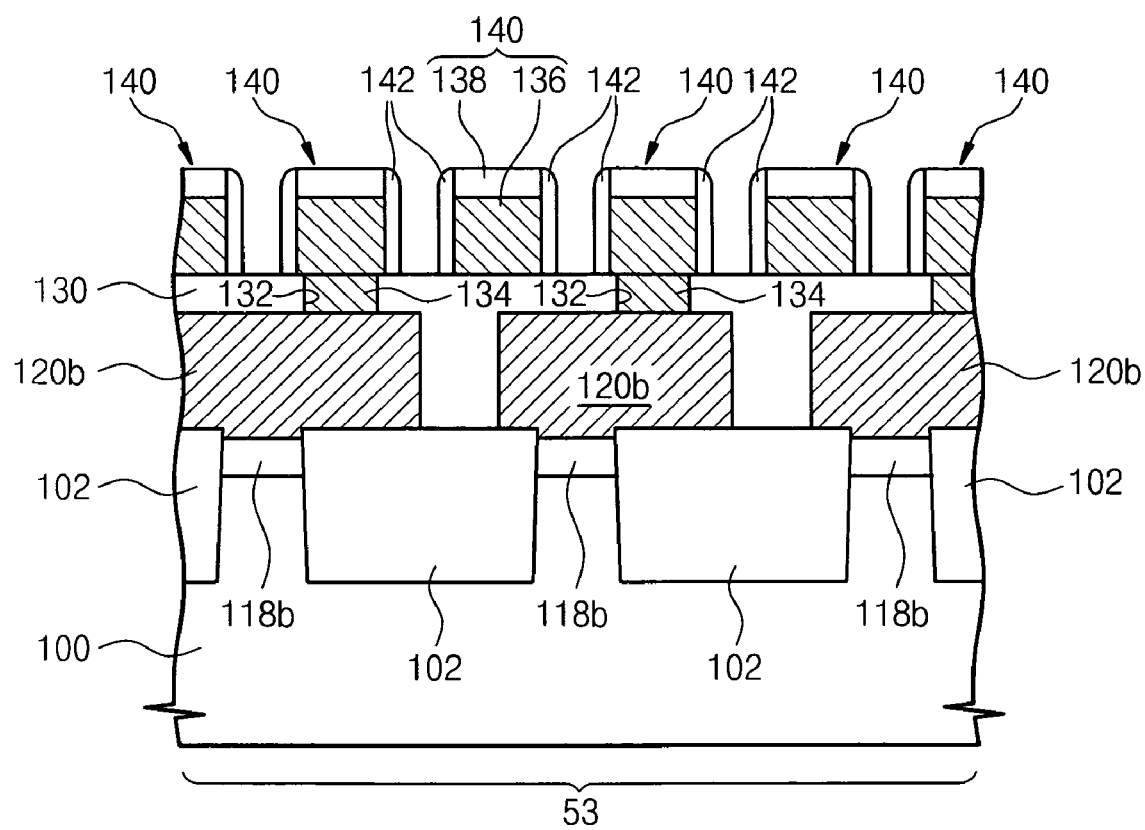
FIG. 11 is a cross-sectional view taken along a line III-III' of FIG. 7A.

As shown in FIG. 7A, bit line contact plugs 134 and bit lines 140 are added to FIG. 6A. The structural characteristics and method of forming of the bit line contact plugs 134 and the bit lines 140 will now be described with reference to FIGS. 7A, 7B, and 11. FIG. 11 is a cross-sectional view taken along a line III-III' of FIG. 7A.

Figure 7B:
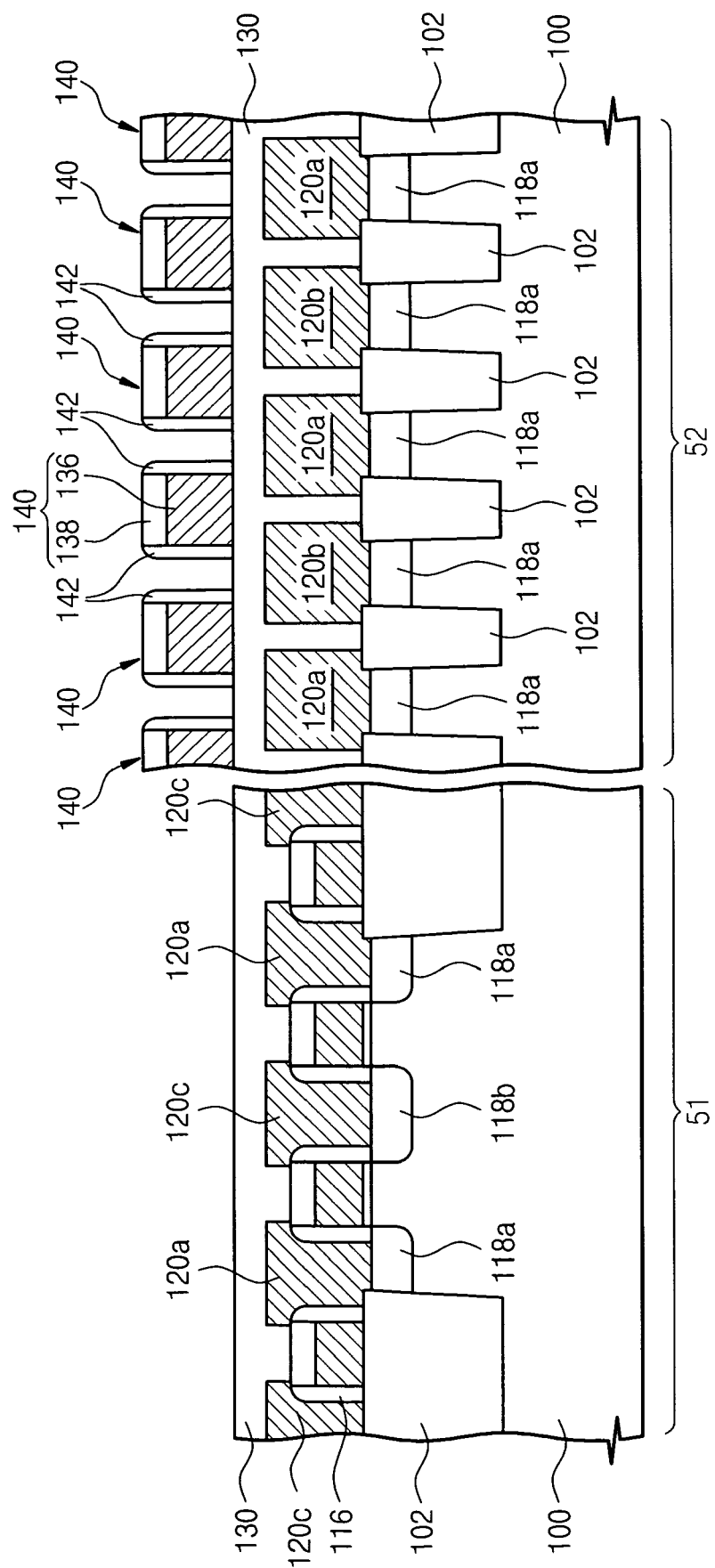

Referring to FIGS. 7A, 7B, and 11, a first interlayer dielectric 130 is formed on the substrate 100 including the pads 120a, 120b and 120c. The first interlayer dielectric 130 may include an oxide layer. The first interlayer dielectric 130 is patterned to form bit line contact holes 132 that respectively expose the bit line pads 120c. Next, bit line contact plugs 134 are formed. The bit line contact plugs 134 fill the bit line contact holes 132. As seen in FIG. 7A, upper surfaces of the bit line contact plugs 134 are represented as a shape in a layout. That is, in FIG. 7A, the upper surfaces of the bit line contact plugs 134 have a rectangular shape, however, they may be formed, for example, in a circular shape by the photolithography process.

A plurality of bit lines 140 are formed on the first interlayer dielectric 130 such that they are arranged parallel to each other. The bit lines 140 extend in the second direction. The bit lines 140 are connected to the bit line contact plugs 134. Each of the bit lines 140 is electrically connected to the second source/drain regions 118b formed in the first active regions 104a of the first row or the second source/drain regions 118b formed in the second active regions 104b of the second row.

More particularly, the bit line contact plugs 134 connected to one bit line 140 are connected to the bit line pads 120c connected to the first active regions 104a of the first row, and the bit line contact plugs 134 connected to another bit line 140 are connected to the bit line pads 120c connected to the second active regions 104b of the second row. That is, the bit lines 140 are connected to the bit line pads 120c of the pair of second pad columns disposed to both sides of the first pad column, respectively.

The bit line contact plugs 134 may include a conductive material, for example, doped polysilicon, tungsten, and/or the like. Each of the bit lines 140 may include a conductive line pattern 136 and a bit line capping insulating pattern 138 that are sequentially stacked. The bit line capping insulating pattern 138 may not be formed. In other wordscase, the bit line 140 may include only the conductive line pattern 136. The conductive line pattern 136 may be formed of tungsten and/or the like. The bit line capping insulating pattern 138 may be include a nitride layer, an oxide nitride layer, and/or the like. Bit line insulating spacers 142 may be formed at both sidewalls of the bit line 140. The bit line insulating spacer 142 may include a nitride layer, an oxide nitride layer, and/or the like.

Figure 8A:
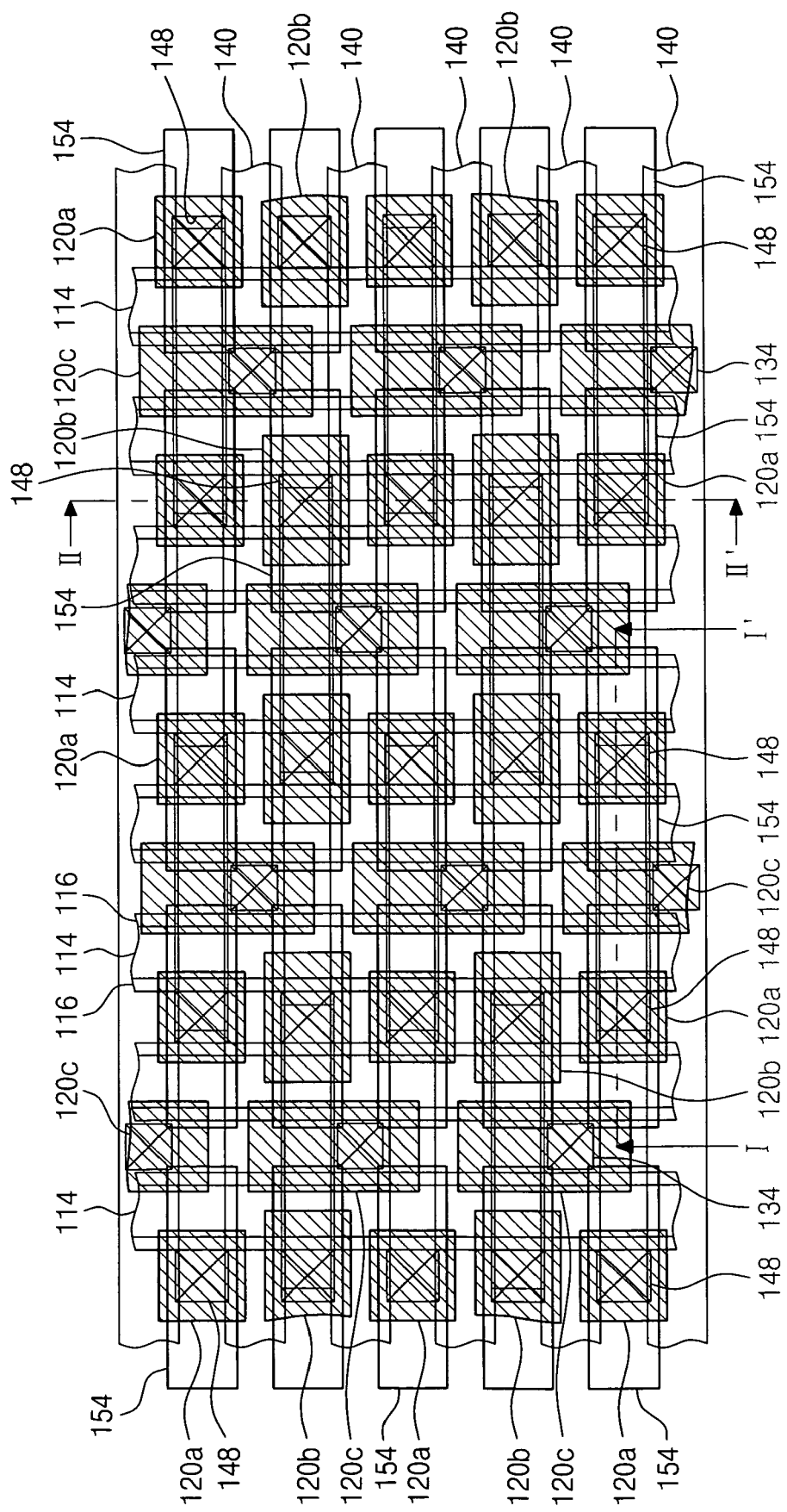
Figure 8B:
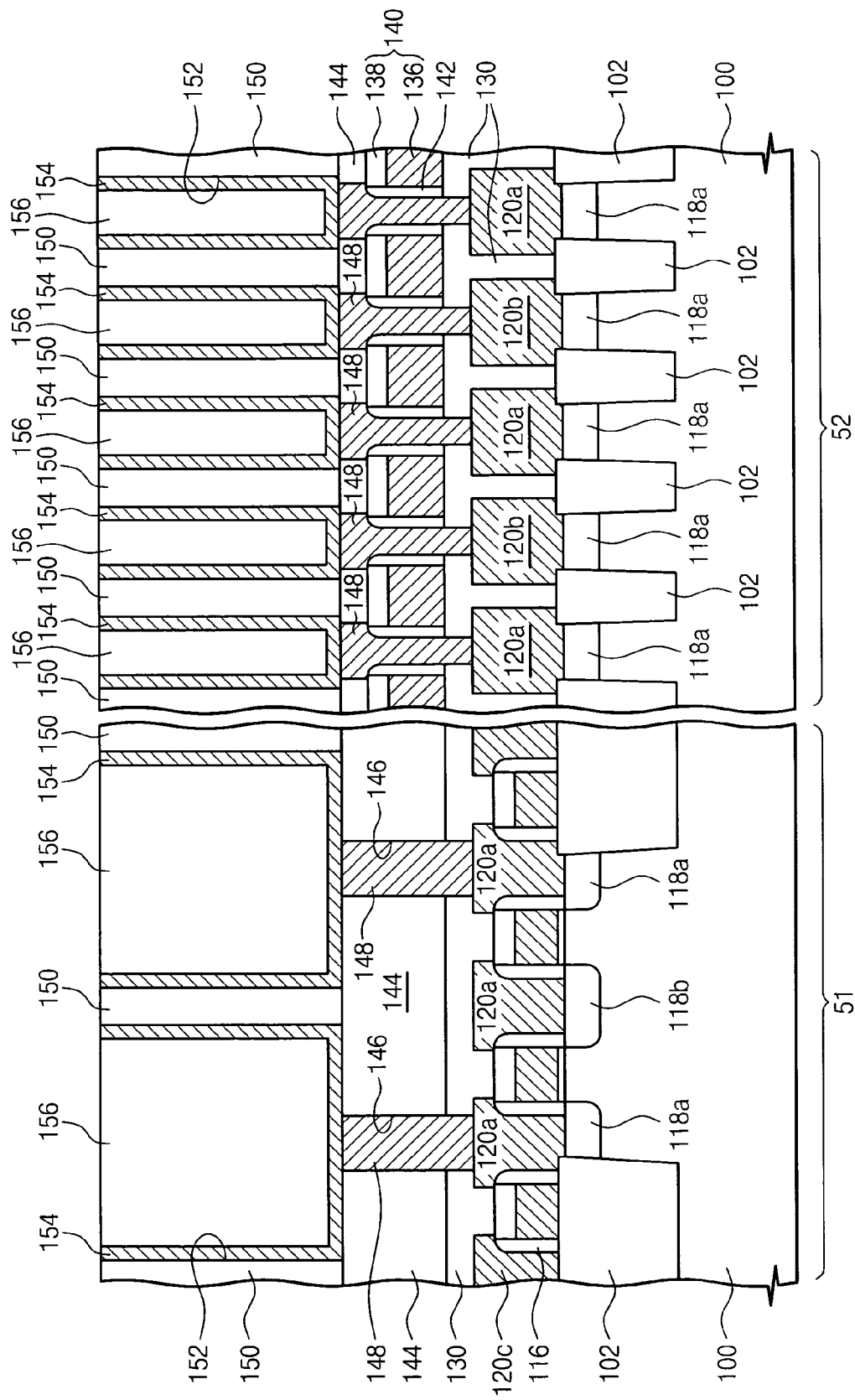

As shown in FIG. 8A, buried contact plugs 148 and storage electrodes 154 are added to the structure shown in FIG. 7A. Referring to FIGS. 8A and 8B, a second interlayer dielectric 144 is formed that covers an entire upper surface of the substrate 100 including the bit lines 140. The second interlayer dielectric 144 may include an oxide layer. At least an upper portion of the second interlayer dielectric 144 may include a nitride layer having an etch selectivity with respect to an oxide layer.

The second and first interlayer dielectrics 144 and 130 are patterned to form buried contact holes 146 that expose the first node pads 120a and the second node pads 120b, respectively. The buried contact holes 146 may be self-aligned with at least the bit line insulating spacers 142. In some embodiments, when the intervals between the bit lines 140 are sufficient, the bit line insulating spacers 142 may not be formed, and the buried contact hole 146 may penetrate the second interlayer dielectric 144 between the bit lines 140 to expose the first node pad 120a or the second node pad 120b.

Buried contact plugs 148 are formed so as to fill the buried contact holes 146. The buried contact plugs 148 may be formed of a conductive material, for example, doped polysilicon, tungsten, and/or the like. The buried contact plugs 148 connected to the first and second node pads 120a and 120b of the first pad column may be arranged in the first direction to form a column. That is, the centers of the buried contact plugs 148 connected the first and second node pads 120a and 120b of the first pad column may be positioned substantially in a straight line extending in the first direction. In FIG. 8A, upper surfaces of the buried contact plugs 148 are represented as a shape in a layout. That is, in FIG. 8A, the upper surfaces of the buried contact plugs 148 have a rectangular shape, however, they may be formed in a circular shape by the photolithography process.

As described above, in some embodiments the third width W3 of the second node pad 120b is larger than the first width W1 of the first node pad 120a. Therefore, an alignment margin of the second node pad 120b and the buried contact plug 148 connected to the second node pad 120b may be increased in the second direction. In addition, a margin for an interval between the buried contact plugs 148 and/or an interval between the storage electrodes 154 can be increased as will be described further herein.

A mold layer 150 is formed on the substrate 100 including the buried contact plugs 148. The mold layer 150 is formed of a material having an etch selectivity with respect to an upper portion of the second interlayer dielectric 144. For example, the mold layer 150 may include an oxide layer. The mold layer 150 is patterned to form capacitor holes 152 that expose corresponding ones of the buried contact plugs 148. As illustrated in FIG. 8A, the capacitor holes 152 may be formed in a shape of a rectangle having a long side in the second direction. The capacitor holes 152 may have rounded corners from the photolithography process used to form the holes 152.

An electrode conductive layer is shown formed conformally on the substrate 100 including the capacitor holes 152 and a sacrifice layer is shown formed on the electrode conductive layer so as to fill the capacitor holes 152. The electrode conductive layer may be formed of doped polysilicon, metal compound, and/or the like. The sacrifice layer is formed of a material having an etch rate equal to or higher than the mold layer 140. For example, the sacrifice layer may include an oxide layer.

The sacrifice layer and the electrode conductive layer are planarized, until the mold layer 150 is exposed to form the storage electrodes 154 and a sacrifice pattern 156. The storage electrodes 154 may be formed in a cylindrical shape. As illustrated, the centers of the storage electrodes 154 electrically connected to the first and second node pads 120a and 120b of the first pad column may be disposed on a straight line extending in the first direction.

Figure 9A:
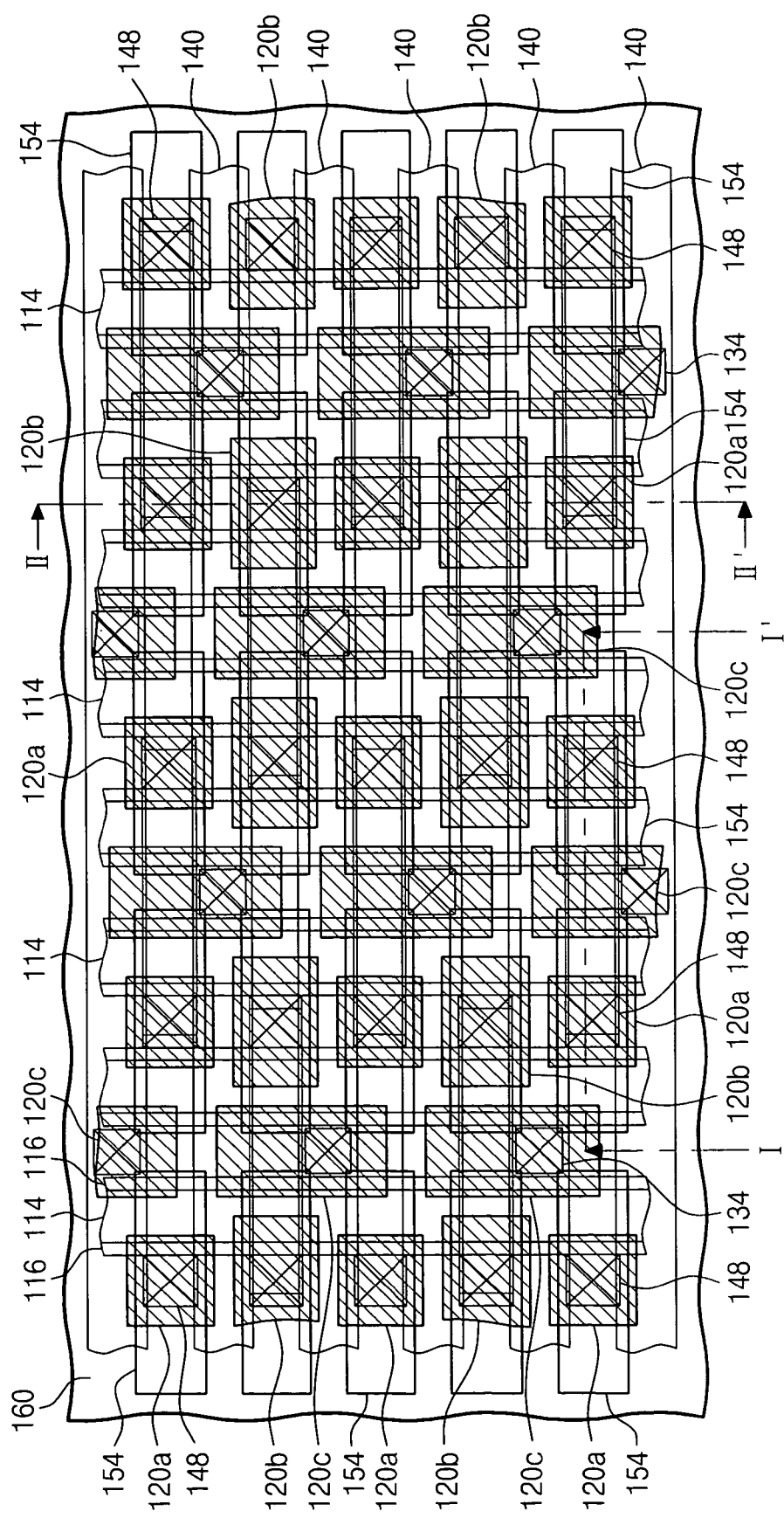

In FIG. 9A, a plate electrode 160 is added to FIG. 8A. Referring to FIGS. 9A and 9B, the mold layer 150 and the sacrifice pattern 156 are removed to expose inner and outer surfaces of the storage electrodes 154. Next, a dielectric layer 158 is formed conformally on surfaces of the storage electrodes 154. The dielectric layer 158 may include an oxide-nitride-oxide (ONO) layer. In some embodiments, the dielectric layer 158 may include a high dielectric layer (for example, a metal oxide such as aluminum oxide, hafnium oxide, and/or the like) having a dielectric constant higher than a nitride layer.

The plate electrode 160 is formed on the dielectric layer 158 so as to cover surfaces of the storage electrodes 154. The plate electrode 160 is formed of a conductive material. For example, the plate electrode 160 may be formed of doped polysilicon, conductive metal compound, and/or the like.

Figure 12:
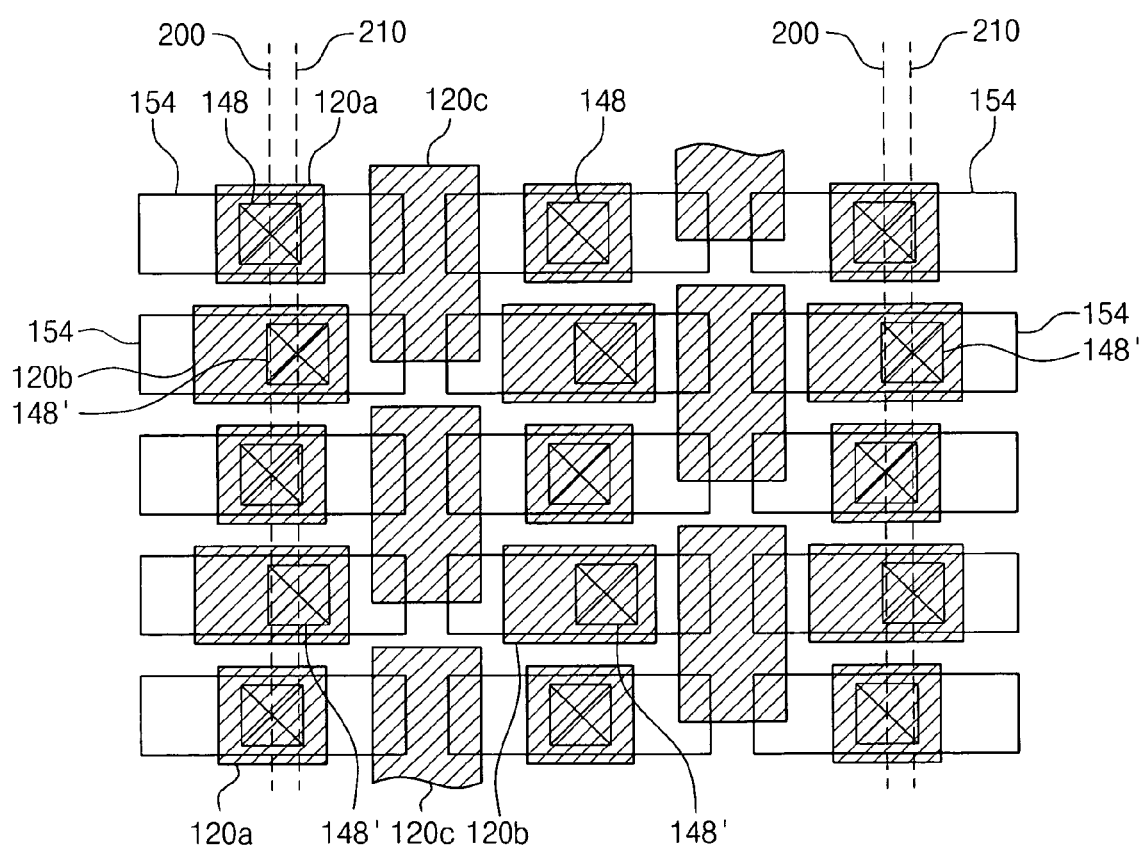
FIG. 12 is a plan view illustrating a DRAM device according to further embodiments of the present invention.
Figure 13:
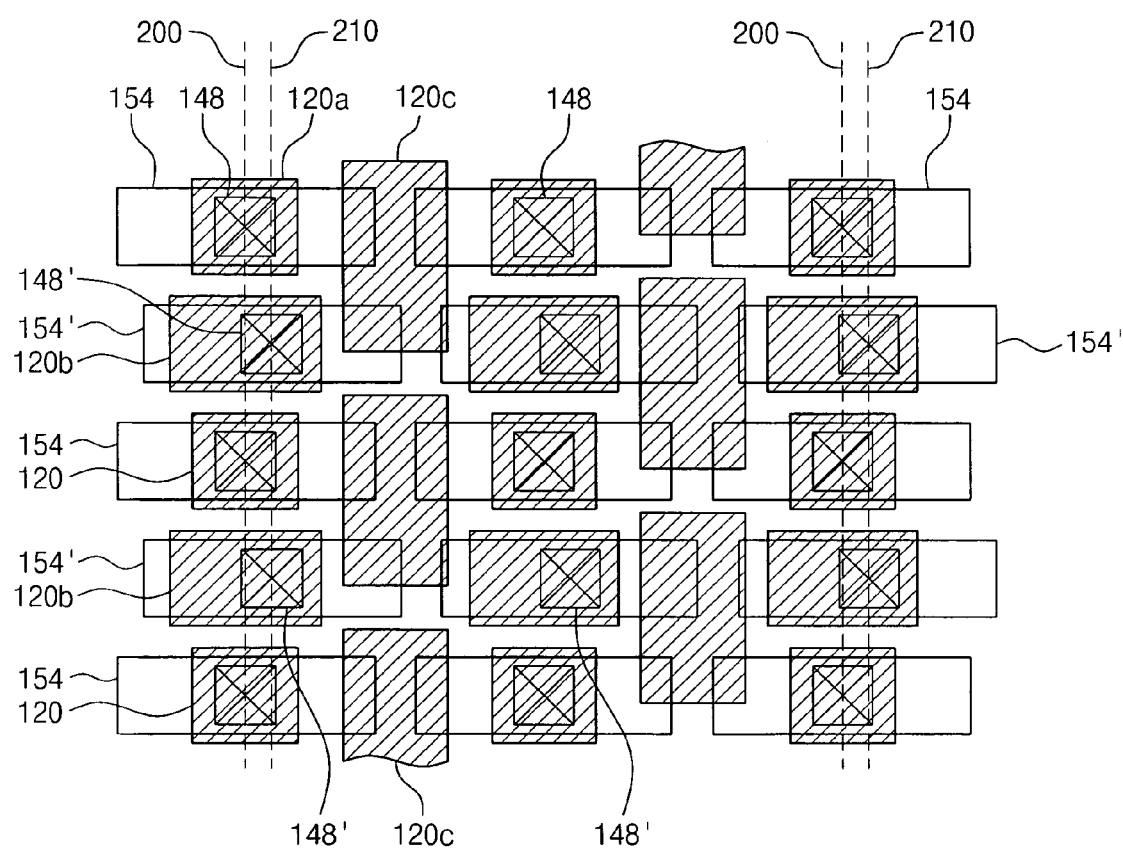
FIG. 13 is a plan view illustrating a DRAM device according to other embodiments of the present invention.

The buried contact plugs 148 and the storage electrodes 154 may be arranged in other manners as will be described, for example, with reference to FIGS. 12 and 13. In FIGS. 12 and 13, only pads, buried contact plugs, and storage electrodes are illustrated in order to simplify characteristics that differ from the previously described embodiments.

FIG. 12 is a plan view illustrating a DRAM device according to further embodiments of the present invention. Referring to FIG. 12, first buried contact plugs 148 are connected to first node pads 120a and second buried contact plugs 148' are connected to second node pads 120b. The first buried contact plugs 148 connected to the first node pads 120a of a first pad column are arranged in the first direction parallel to the first pad column. The centers of the first buried contact plugs 148 are disposed substantially on a first straight line 200 extending in the first direction. The second buried contact plugs 148' connected to the second node pads 120b of the first pad column are arranged in the first direction. The centers of the second buried contact plugs 148' are disposed substantially on a second straight line 210 that extends in the first direction. The first and second straight lines 200 and 210 are separated from each other in the second direction, such that they are parallel to each other. That is, the first and second buried contact plugs 148 and 148' connected to the first and second node pads 120 and 120b of the first pad column are arranged in a zigzag shape in the first direction.

As described above, upper surfaces of the first and second buried contact plugs 148 and 148' may have a substantially circular shape as a result of the photolithography process used in their formation. Sufficient intervals between the first and second contact plugs 148 and 148' adjacent to each other can be increased by arranging the first and second buried contact plugs 148 and 148' in the illustrated zigzag shape in the first direction. As the width of the second node pad 120b in the second direction is larger than the width of the first node pad 120a of the second direction, the first and second buried contact plugs 148 and 148' can more readily be arranged in the zigzag shape.

As illustrated in the embodiments of FIG. 12, all of the centers of storage electrodes 154 connected to the first and second buried contact plugs 148 and 148' of the first pad column may be disposed on the first straight line 200. However, the storage electrodes 154 may be arranged in other forms as will be described, for example, with reference to FIG. 13.

FIG. 13 is a plan view illustrating a DRAM device according to other embodiments of the present invention. Referring to FIG. 13, first storage electrodes 154 are connected to the first buried contact plugs 148 and second storage electrodes 154' are connected to the second buried contact plugs 148'. The centers of the first storage electrodes 154 electrically connected to the first node pads 120a of the first pad column are arranged on the first straight line 200 and the centers of the second storage electrodes 154' electrically connected to the second node pads 120b of the first pad column are arranged on the second straight line 210. As described above, the first and second straight lines 200 and 210 are parallel to each other. Therefore, the first and second storage electrodes 154 and 154' connected to the first and second node pads 120a and 120b of the first pad row are alternately arranged in a zigzag shape in the first direction. As described above, the first and second storage electrodes 154 and 154' may have rounded corners as a result of the photolithography process used in their formation. Intervals between the first and second storage electrodes 154 and 154' adjacent to each other can be increased. In addition, as the first and second storage electrodes 154 and 154' are arranged in the zigzag shape, they may be formed in a substantially cylindrical shape. Therefore, leaning of the first and second storage electrodes 154 and 154' can be limited or even prevented. In the embodiments of FIG. 13, all of the centers of the first and second buried contact plugs 148 and 148' can be disposed on the first straight line 200.

In the above-described embodiments, the storage electrodes 154 have a cylindrical shape. However, the storage electrodes may be formed in other shapes.

As described above, according to some embodiments of the present invention, a first mask layer is patterned to form first node pad mask patterns and bit line pad mask patterns, and then a second mask layer is conformally formed. Next, second node pad mask patterns are formed so as to fill empty regions between the first node pad mask patterns. That is, the first node pad mask patterns and the bit line pad mask patterns are formed to have a wide interval using one photolithography process and then the second node pad mask patterns are self-aligned. Next, a pad conductive layer is etched using the first node, the second node, and the bit line pad mask patterns as a mask to form a first node pad, a second node pad, and a bit line pad. Therefore, a process margin of the photolithography process may be increased. In addition, as an additional photolithography process is not required, the productivity of the process may be improved.

A width of the second node pad in some embodiments is larger than a width of the first node pad. Therefore, an alignment margin between the second node pad and a buried contact plug connected to the second node pad can be improved. In addition, buried contact plugs connected to the first node pads and buried contact plugs connected to the second node pad can be more readily arranged in a zigzag shape in one direction. As a result, intervals between the adjacent buried contact plugs may be increased. Furthermore, storage electrodes electrically connected to the first node pads and storage electrodes electrically connected to the second node pads can be arranged in a zigzag shape in one direction. As a result, a desired/sufficient distance between the adjacent storage electrodes may be more readily obtained. Additionally, the storage electrodes may be more easily formed by forming the storage electrodes in a substantially cylindrical shape.

As described above, some embodiments of the present invention provide a DRAM device optimized for high integration and methods of forming the same. Some embodiments further provide a DRAM device optimized for high integration by defining pads connected to capacitors closely and definitely and methods of forming the same.

The foregoing is illustrative of the present invention and is not to be construed as limiting thereof. Although a few embodiments of the present invention have been described, those skilled in the art will readily appreciate that many modifications are possible in the embodiments without materially departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A dynamic random access memory (DRAM) device, comprising:

first node pads and second node pads alternately arranged in a first direction on a substrate to form a first pad column, wherein a width of the second node pads in a second direction, perpendicular to the first direction, is greater than a width of the first node pads in the second direction; and storage electrodes electrically connected to the first node pads and the second node pads.

2. The DRAM device of claim 1, further comprising bit line pads arranged in the first direction on the substrate to form a second pad column, the second pad column being adjacent the first pad column and displaced therefrom in the second direction.

3. The DRAM device of claim 2, wherein adjacent ones of the first node pads and the second node pads are separated from each other by a first interval and wherein adjacent ones of the first node pads and the bit line pads are separated from each other by a second interval and wherein adjacent ones of the bit line pads are separated from each other by a third interval, the second and third intervals being larger than the first interval and no more than twice the first interval.

4. The DRAM device of claim 3, wherein adjacent ones of the second node pads and the bit line pads are separated from each other by a fourth interval that is substantially equal to the first interval.

5. The DRAM device of claim 2, wherein a width of the first node pads in the first direction is substantially equal to a width of the second node pads in the first direction.

6. The DRAM device of claim 2, further comprising:

first active regions in the substrate and arranged with a predetermined pitch therebetween in the first direction to form a first column; and second active regions in the substrate and arranged in the first direction to form a second column adjacent the first column and displaced therefrom in the second direction, each of the second active regions of the second column being located at a position displaced from a corresponding one of the first active regions by about ½ of the predetermined pitch in the first direction and by a predetermined distance in the second direction;

wherein the first node pads are connected to end portions of the first active regions proximate to the second column and the second node pads are connected to end portions of the second active region proximate to the first column; and wherein a second plurality of bit line pads are arranged in the first direction on the substrate to form another second pad column adjacent the first pad column on a side opposite from the second pad column, the second pad column and another second pad column defining a pair of second pad columns, and wherein the bit line pads included in one of the pair of second pad columns are connected to predetermined regions of the first active regions and the bit line pads included in the other of the pair of second pad columns are connected to predetermined regions of the second active regions.

7. The DRAM device of claim 6, further comprising:

first source/drain regions disposed in end portions of the first active regions connected to the first node pads and in end portions of the second active regions connected to the second node pads, respectively;

second source/drain regions in the first and second active regions connected to the bit line pads;

gate lines crossing the first active region between the first and second source/drain regions and the second active regions between the first and second source/drain regions, respectively, each of the gate lines comprising a gate insulating layer, a gate electrode on the gate insulating layer and a gate capping insulating pattern on the gate electrode; and gate insulating spacers on sidewalk of the gate lines, wherein upper surfaces of the first node pads, the second node pads, and the bit line are higher than upper surfaces of the gate lines.

8. The DRAM device of claim 2, further comprising:
a first interlayer dielectric disposed on the substrate that covers the first node pads, the second node pads, and the bit line pads;
bit line contact plugs extending through the first interlayer dielectric to contact corresponding ones of the bit line pads;
bit lines on the first interlayer dielectric that connect to corresponding ones of the bit line contact plugs;
a second interlayer dielectric covering the bit lines and the first interlayer dielectric; and
buried contact plugs extending through the second and first interlayer dielectrics and connected to corresponding ones of the first node pads or the second node pads,
wherein the storage electrodes are positioned on the second interlayer dielectric and are connected to corresponding ones of the buried contact plugs.

9. The DRAM device of claim 8, further comprising bit line insulating spacers on sidewalk of the bit lines, wherein the bit lines comprise a conductive line pattern and a bit line capping insulating pattern on the conductive line pattern and wherein the buried contact plugs are self-aligned with the bit line capping insulating pattern and the bit line insulating spacers.

10. The DRAM device of claim 8, wherein the buried contact plugs are disposed substantially aligned on a straight line that extends in the first direction.

11. The DRAM device of claim 8, wherein the buried contact plugs connected to the first node are disposed substantially aligned on a first straight line that extends in the first direction and wherein the buried contact plugs connected to the second node pads are disposed substantially aligned on a second straight line extending parallel to the first straight line.

12. The DRAM device of claim 2, wherein the storage electrodes are disposed substantially aligned on a straight line that extends in the first direction.

13. The DRAM device of claim 2, wherein the storage electrodes connected to the first node pads are disposed substantially aligned on a first straight line that extends in the first direction and the storage electrodes connected to the second node pads are disposed substantially aligned on a second straight line extending parallel to the first straight line.

14. The DRAM device of claim 2, further comprising:
a dielectric layer on surfaces of the storage electrodes; and
a plate electrode on the dielectric layer that covers surfaces of the storage electrodes.

15. A method of forming a DRAM device, the method comprising:
forming first node pads and second node pads alternately arranged in a first direction to form a first pad column, wherein a width of the second node pads in a second direction perpendicular to the first direction is larger than a width of the first node pads in the second direction; and
forming storage electrodes electrically connected to the first node pads and the second node pads of the first pad column.

16. The method of claim 15, further comprising:
forming bit line pads arranged in the first direction on the substrate to form a second pad column, the second pad column being adjacent the first pad column and displaced therefrom in the second direction.

17. The method of claim 16, wherein the forming the first node pads and the second node pads and forming the bit line pads comprise:

forming a pad conductive layer on the substrate;
forming a first mask layer on the pad conductive layer;
patterning the first mask layer to form first node pad mask patterns arranged along the first pad column and bit line pad mask patterns arranged along the second pad column;
forming a second mask layer on a surface of the substrate including the patterned first mask layer;
forming second node pad mask patterns on the second mask layer that fills empty regions between adjacent pairs of the first node pad mask patterns;
etching the second mask layer using the first node pad mask patterns, the second node pad mask patterns and the bit line pad mask patterns as an etch mask to expose the pad conductive layer between the first node pad mask patterns, the second node pad mask patterns, and the bit line pad mask patterns; and
etching the exposed pad conductive layer to form the first node pads, the second node pads and the bit line pads.

18. The method of claim 17, wherein an interval between adjacent ones of the first node pad mask patterns and bit line pad mask patterns and an interval between adjacent ones of the bit line pad mask patterns are greater than a thickness of the second mask layer and no greater than twice the thickness of the second mask layer.

19. The method of claim 17, wherein an interval between the second node pad mask pattern and the bit line pad mask pattern adjacent thereto and an interval between the first and second node pad mask patterns adjacent to each other are equal to the thickness of the second mask layer.

20. The method of claim 17, wherein forming the first mask layer is preceded by forming a hard mask layer having an etch selectivity with respect to the pad conductive layer on the pad conductive layer and wherein etching the second mask layer comprises successively etching the second mask layer and the hard mask layer using the first node pad mask patterns, the second node pad mask patterns, and the bit line pad mask patterns as a mask.

21. The method of claim 16, wherein forming the first node pads and the second node pads and forming the bit line pads is preceded by forming a device isolation layer on the substrate that defines first active regions arranged with a predetermined pitch in the first direction to form a first column and second active regions adjacent a side of the first column and displaced therefrom in the second direction on the substrate that are arranged in the first direction to form a second column, wherein each of the second active regions of the second column are located at a position displaced from a corresponding one of the first active regions by about ½ of the predetermined pitch in the first direction and by a predetermined distance in the second direction;
wherein the first node pads are connected to end portions of the first active regions adjacent to the second column and the second node pads are connected to end portions of the second active region adjacent to the first column; and
wherein forming bit line pads includes forming a second plurality of bit line pads arranged in the first direction on the substrate to form another second pad column adjacent the first pad column on a side opposite from the second pad column, the second pad column and another second pad column defining a pair of second pad columns and wherein the bit line pads included in one of the pair of second pad columns are connected to predetermined regions of the first active regions and the bit line pads included in the other of the pair of second pad columns are connected to predetermined regions of the second active regions.

22. The method of claim 21, wherein forming the first node pads and the second node pads and forming the bit line pads are preceded by:

forming gate lines crossing the first active regions and second active regions;

injecting dopant ions into the first and second active regions using the gate lines as a mask to form first and second source/drain regions; and forming gate insulating spacers on sidewalls of the gate lines, wherein the first source/drain regions are formed in end portions of the first and second active regions connected to the first and second node pads, and the second source/drain regions are formed in the first and second active regions connected to the bit line pads.

23. The method of claim 16, wherein forming the storage electrodes is preceded by:

forming a first interlayer dielectric on the substrate that covers the first node pads, the second node pads, and the bit line pads;

forming bit line contact plugs extending through the first interlayer dielectric to contact the bit line pads;

forming bit lines connected to the bit line contact plugs on the first interlayer dielectric;

forming a second interlayer dielectric on an upper surface of the substrate; and forming buried contact plugs extending through the second and first interlayer dielectrics to contact the first and second node pads, wherein the storage electrodes are formed on the second interlayer dielectric and contacting the buried contact plugs.

24. The method of claim 23, wherein centers of the buried contact plugs connected to the first node pads are on a first straight line that extends in the first direction and centers of the buried contact plugs connected to the second node pads are on a second straight line extending parallel to the first straight line.

25. The method of claim 16, wherein centers of the storage electrodes connected to the first node pads are on a first straight line that extends in the first direction and centers of the storage electrodes connected to the second node pads are disposed on a second straight line extending parallel to the first straight line.

* * * * *